(12) United States Patent
Nishida et al.

(10) Patent No.: US 10,263,008 B2
(45) Date of Patent: Apr. 16, 2019

(54) SEMICONDUCTOR MEMORY DEVICE AND METHOD OF MANUFACTURING THE SAME

(71) Applicant: TOSHIBA MEMORY CORPORATION, Minato-ku (JP)

(72) Inventors: Daisuke Nishida, Mie (JP); Katsuyuki Sekine, Yokkaichi (JP); Hirokazu Ishigaki, Yokkaichi (JP); Yasuhiro Shimura, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 212 days.

(21) Appl. No.: 14/986,853

(22) Filed: Jan. 4, 2016

(65) Prior Publication Data

US 2017/0018565 A1 Jan. 19, 2017

Related U.S. Application Data

(60) Provisional application No. 62/192,326, filed on Jul. 14, 2015.

(51) Int. Cl.
| | |
|---|---|
| *H01L 27/11582* | (2017.01) |
| *H01L 27/1157* | (2017.01) |
| *H01L 21/02* | (2006.01) |
| *H01L 27/11573* | (2017.01) |

(52) U.S. Cl.
CPC .... *H01L 27/11582* (2013.01); *H01L 21/0223* (2013.01); *H01L 27/1157* (2013.01); *H01L 27/11573* (2013.01); *H01L 21/02252* (2013.01)

(58) Field of Classification Search
CPC ........... H01L 21/0223; H01L 21/02252; H01L 27/1157; H01L 27/11573; H01L 27/11582
See application file for complete search history.

(56) References Cited

U.S. PATENT DOCUMENTS

| 8,247,863 | B2 | 8/2012 | Fukuzumi et al. | |
|---|---|---|---|---|
| 8,436,415 | B2 | 5/2013 | Kidoh et al. | |
| 2009/0173981 | A1* | 7/2009 | Nitta | H01L 21/84 257/302 |
| 2012/0329224 | A1* | 12/2012 | Kong | H01L 21/0332 438/268 |
| 2013/0250676 | A1* | 9/2013 | Hishida | G11C 16/06 365/185.2 |

FOREIGN PATENT DOCUMENTS

| JP | 2009-164485 | 7/2009 |
|---|---|---|
| JP | 2010-199314 | 9/2010 |
| JP | 2011-54802 | 3/2011 |
| JP | 2011-66348 | 3/2011 |

\* cited by examiner

*Primary Examiner* — Joseph Galvin, III
(74) *Attorney, Agent, or Firm* — Oblon, McClelland, Maier & Neustadt, L.L.P.

(57) ABSTRACT

According to an embodiment, a semiconductor memory device comprises a plurality of control gate electrodes, a semiconductor layer, and a first insulating layer. The plurality of control gate electrodes are stacked above a substrate. The semiconductor layer has as its longitudinal direction a direction perpendicular to the substrate, and faces the plurality of control gate electrodes. The first insulating layer is positioned between the semiconductor layer and the control gate electrode. In addition, part of the first insulating layer is a charge accumulation layer. Moreover, part of the first insulating layer is an oxide layer positioned upwardly of the charge accumulation layer.

10 Claims, 33 Drawing Sheets

SEMICONDUCTOR MEMORY DEVICE AND METHOD OF MANUFACTURING THE SAME

CROSS-REFERENCE TO RELATED APPLICATIONS

This application is based upon and claims the benefit of U.S. Provisional Patent Application No. 62/192,326, filed on Jul. 14, 2015, the entire contents of which are incorporated herein by reference.

FIELD

Embodiments described herein relate to a semiconductor memory device and a method of manufacturing the same.

BACKGROUND

Description of the Related Art

A flash memory that stores data by accumulating a charge in a charge accumulation layer, is known. Such a flash memory is connected by a variety of systems such as NAND type or NOR type, and configures a semiconductor memory device. In recent years, increasing of capacity and raising of integration level of such a nonvolatile semiconductor memory device have been proceeding. Moreover, a semiconductor memory device in which memory cells are disposed three-dimensionally (three-dimensional type semiconductor memory device) has been proposed to raise the integration level of the memory.

DETAILED DESCRIPTION

A semiconductor memory device according to an embodiment comprises a plurality of control gate electrodes, a semiconductor layer, and a first insulating layer. The plurality of control gate electrodes are stacked above a substrate. The semiconductor layer has as its longitudinal direction a direction perpendicular to the substrate, and faces the plurality of control gate electrodes. The first insulating layer is positioned between the semiconductor layer and the control gate electrode. In addition, part of the first insulating layer is a charge accumulation layer. Moreover, part of the first insulating layer is an oxide layer positioned upwardly of the charge accumulation layer.

Next, nonvolatile semiconductor memory devices according to embodiments will be described in detail with reference to the drawings. Note that these embodiments are merely examples, and are not shown with the intention of limiting the present invention.

For example, the nonvolatile semiconductor memory devices described below have a structure in which a memory string extends linearly in a perpendicular direction to a substrate, but a similar structure may be applied also to a U-shaped structure in which the memory string is doubled back on an opposite side midway. Moreover, each of the drawings of the nonvolatile semiconductor memory devices employed in the embodiments below is schematic, and thicknesses, widths, ratios, and so on, of layers are different from those of the actual nonvolatile semiconductor memory devices.

In addition, the nonvolatile semiconductor memory devices described below relate to nonvolatile semiconductor memory devices having a structure in which a plurality of MONOS (Metal-Oxide-Nitride-Oxide-Semiconductor) type memory cells (transistors) are provided in a height direction, each of the MONOS type memory cells including: a semiconductor layer acting as a channel body provided in a column shape perpendicularly to a substrate; and a control gate electrode layer made of metal provided facing a side surface of the semiconductor layer via a charge accumulation layer. However, this is also not intended to limit the present invention, and the present invention may be applied also to a memory cell of another form of charge accumulation layer, for example, a SONGS (Semiconductor-Oxide-Nitride-Oxide-Semiconductor) type memory cell including a control gate electrode made of a semiconductor, or a floating gate type memory cell.

[First Embodiment]
[Semiconductor Memory Device]

Figure 1:
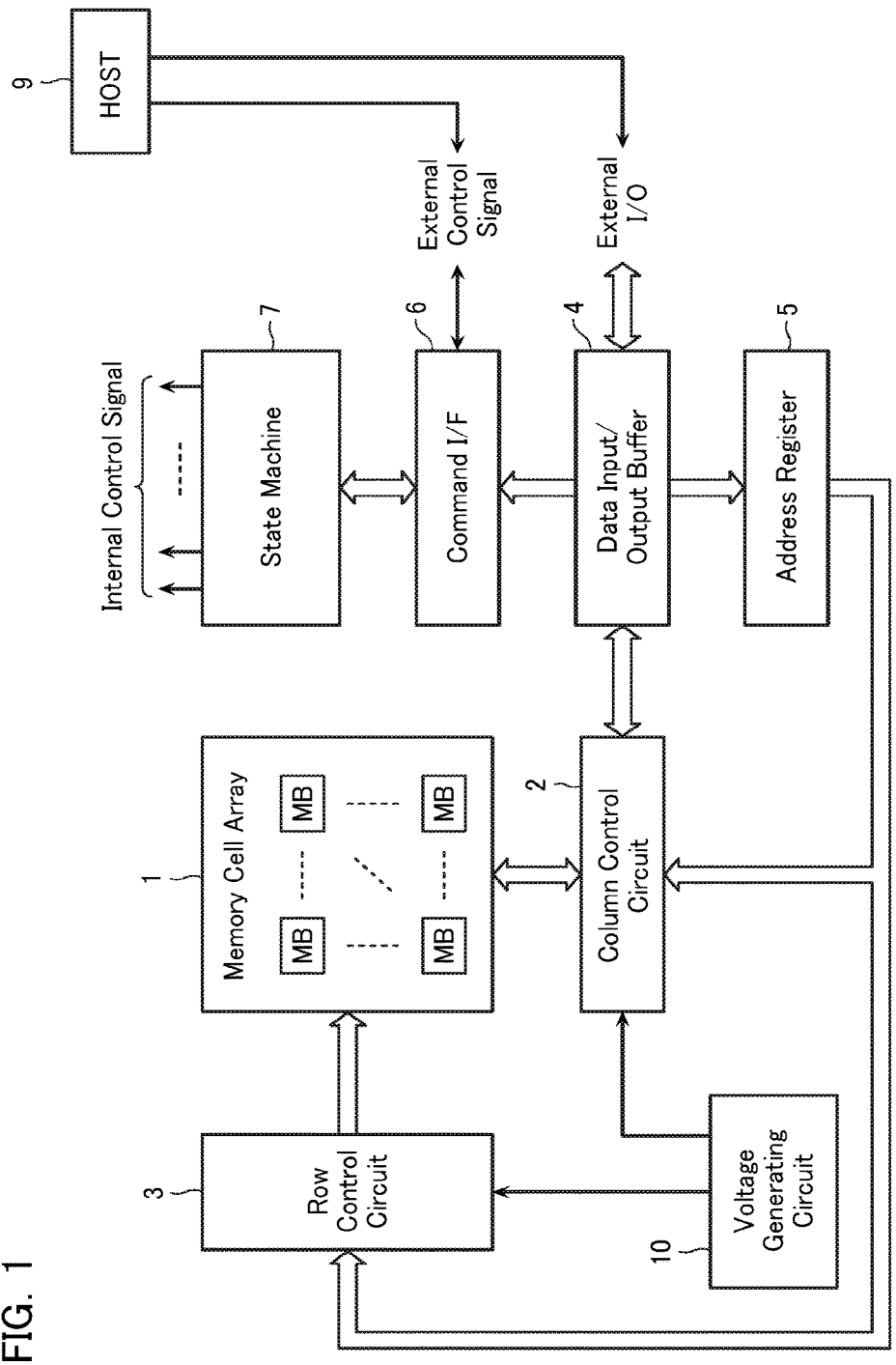
FIG. 1 is a block diagram of a nonvolatile semiconductor memory device according to a first embodiment.

FIG. 1 is a block diagram of a nonvolatile semiconductor memory device according to a first embodiment. The same nonvolatile semiconductor memory device stores user data inputted from an external host 9, in a certain address in a memory cell array 1. In addition, the nonvolatile semiconductor memory device reads user data from a certain address in the memory cell array 1, and outputs the user data to the external host 9.

That is, as shown in FIG. 1, the nonvolatile semiconductor memory device comprises the memory cell array 1 that stores user data. The memory cell array 1 comprises a plurality of memory blocks MB. As will be described later with reference to FIG. 2, these memory blocks MB each comprise: a plurality of memory cells MC; and a bit line BL and a word line WL connected to these memory cells MC.

As shown in FIG. 1, the nonvolatile semiconductor memory device comprises a column control circuit 2 provided in a periphery of the memory cell array 1. When performing write of user data, the column control circuit 2 transfers a voltage generated by a voltage generating circuit 10 to a desired bit line BL, according to the inputted user data. Moreover, the column control circuit 2 comprises an unillustrated sense amplifier, and when performing read of user data, detects a voltage or potential of a certain bit line BL.

As shown in FIG. 1, the nonvolatile semiconductor memory device comprises a row control circuit 3 provided in a periphery of the memory cell array 1. The row control circuit 3 transfers a voltage generated by the voltage generating circuit 10 to a desired word line WL, and so on, according to inputted address data.

As shown in FIG. 1, the nonvolatile semiconductor memory device comprises an address register 5 that supplies address data to the column control circuit 2 and the row control circuit 3. The address register 5 stores address data inputted from a data input/output buffer 4.

As shown in FIG. 1, the nonvolatile semiconductor memory device comprises the voltage generating circuit 10 that supplies a voltage to the memory cell array 1 via the column control circuit 2 and the row control circuit 3. The voltage generating circuit 10 generates and outputs a voltage of a certain magnitude at a certain timing, based on an internal control signal inputted from a state machine 7.

As shown in FIG. 1, the nonvolatile semiconductor memory device comprises the state machine 7 that inputs the internal control signal to the voltage generating circuit 10, and so on. The state machine 7 receives command data from the host 9, via a command interface 6, and performs management of read, write, erase, input/output of data, and so on.

As shown in FIG. 1, the nonvolatile semiconductor memory device comprises the data input/output buffer 4 which is connected to the external host 9 via an I/O line. The data input/output buffer 4 receives write data from the external host 9, and transfers the write data to the column control circuit 2. Moreover, the data input/output buffer 4 receives command data from the external host 9, and transfers the command data to the command interface 6. In addition, the data input/output buffer 4 receives address data from the external host 9, and transfers the address data to the address register 5. Furthermore, the data input/output buffer 4 receives read data from the column control circuit 2, and transfers the read data to the external host 9.

As shown in FIG. 1, the nonvolatile semiconductor memory device comprises the command interface 6 that receives an external control signal from the external host 9. The command interface 6 determines which of user data, command data, and address data data inputted to the data input/output buffer 4 is, based on the external control signal inputted from the external host 9, and controls the data input/output buffer 4.

In addition, the command interface 6 transfers to the state machine 7 command data received from the data input/output buffer 4.

Note that the column control circuit 2, the row control circuit 3, the state machine 7, the voltage generating circuit 10, and so on, configure a control circuit that controls the memory cell array 1.

Figure 2:
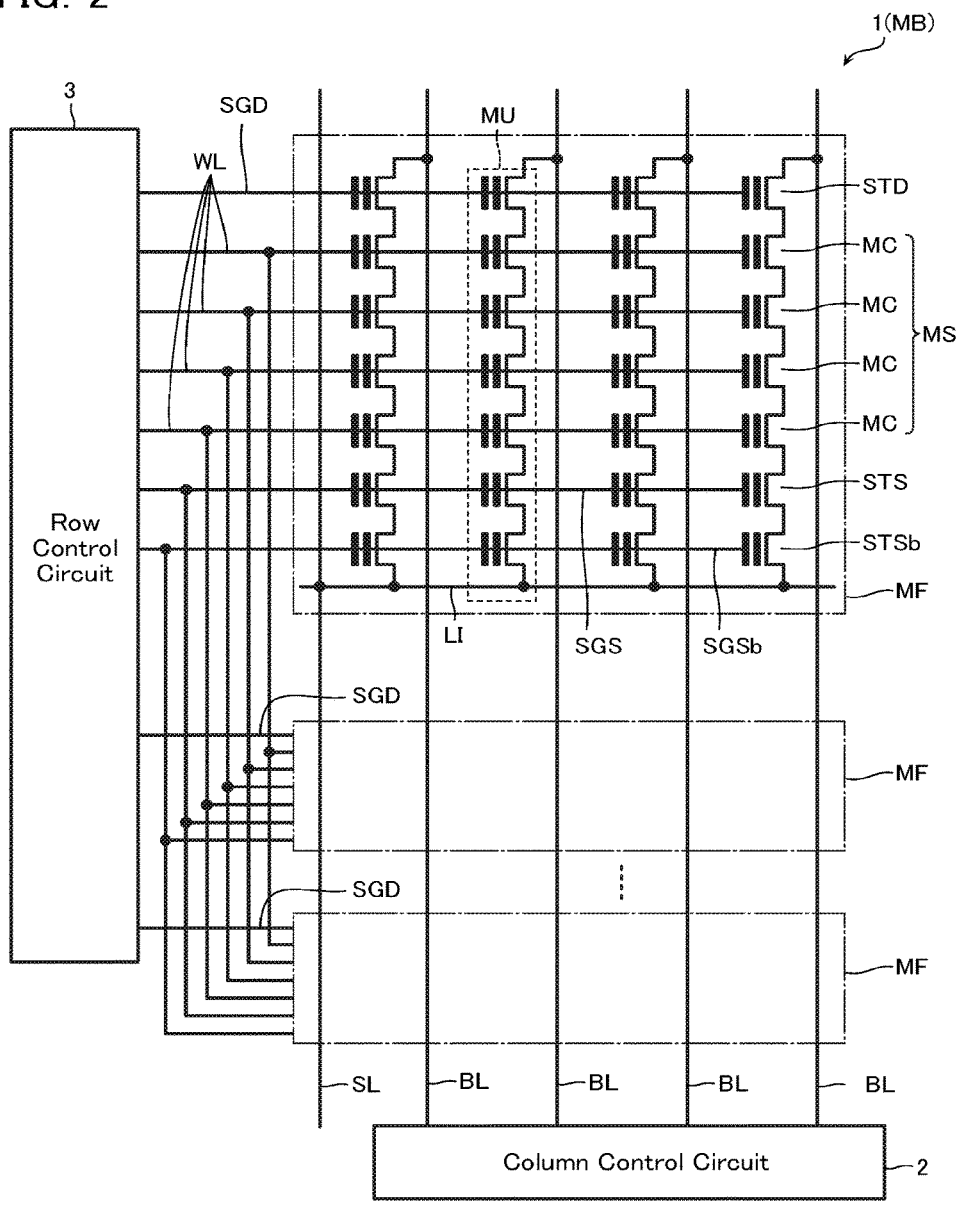
FIG. 2 is a circuit diagram showing a configuration of part of the same nonvolatile semiconductor memory device.

Next, a circuit configuration of part of the memory cell array 1 according to the present embodiment will be described with reference to FIG. 2. FIG. 2 is an equivalent circuit diagram showing a configuration of the memory block MB configuring the memory cell array 1.

As shown in FIG. 2, the memory block MB comprises a plurality of the memory cells MC. The memory cells MC each store a one-bit portion or a multiple-bit portion of data configuring the above-mentioned user data. Moreover, in the memory block MB shown in FIG. 2, a certain drain side select gate line SGD and a certain word line WL are selected by the row control circuit 3, whereby a certain number of the memory cells MC are selected. These selected memory cells MC each have a bit line BL connected thereto, and a current or voltage of these bit lines BL attains a different magnitude according to data recorded in the memory cell MC. The column control circuit 2 determines data recorded in the plurality of memory cells MC by detecting the current or voltage of this bit line BL, and outputs this data as user data.

As shown in FIG. 2, the memory blocks MB each comprise a plurality of memory fingers MF. Commonly connected to these plurality of memory fingers MF are a plurality of the bit lines BL and a source line SL. Each of the memory fingers MF is connected to the column control circuit 2 via the bit lines BL, and is connected to an unillustrated source line driver via the source line SL.

The memory finger MF comprises a plurality of memory units MU that have their one ends connected to the bit lines BL and have their other ends connected to the source line SL via a source contact LI. The memory units MU included in one memory finger MF are all connected to different bit lines BL.

As shown in FIG. 2, the memory unit MU comprises a plurality of the memory cells MC connected in series. As will be mentioned later, the memory cell MC comprises: a semiconductor layer functioning as a channel; a charge accumulation layer; and a control gate electrode. Moreover, the memory cell MC accumulates a charge in the charge accumulation layer based on a voltage applied to the control gate electrode, and changes a control gate voltage (threshold voltage) for rendering the channel in a conductive state. Hereafter, the plurality of memory cells MC connected in series will be called a "memory string MS". The row control circuit 3 transfers a voltage to a certain word line WL, thereby transferring this voltage to the control gate electrode of a certain memory cell MC in the memory string MS.

As shown in FIG. 2, commonly connected to the control gate electrodes of pluralities of the memory cells MC configuring different memory strings MS are, respectively, the word lines WL. These pluralities of memory cells MC are connected to the row control circuit 3 via the word lines WL. Moreover, in the example shown in FIG. 2, the word lines WL are provided independently to each of the memory cells MC included in the memory unit MU, and are provided commonly for all of the memory units MU included in one memory block MB.

As shown in FIG. 2, the memory unit MU comprises a drain side select gate transistor STD connected between the memory string MS and the bit line BL. Connected to a control gate of the drain side select gate transistor STD is the drain side select gate line SGD. The drain side select gate line SGD is connected to the row control circuit 3, and selectively connects the memory string MS and the bit line BL based on an inputted signal. Moreover, in the example shown in FIG. 2, the drain side select gate line SGD is provided independently to each of the memory fingers MF, and is commonly connected to the control gates of all of the drain side select gate transistors STD in the memory finger MF. The row control circuit 3 selects a certain drain side select gate line SGD, thereby selectively connecting all of the memory strings MS in a certain memory finger MF to the bit lines BL.

Moreover, as shown in FIG. 2, the memory unit MU comprises a source side select gate transistor STS and a lowermost layer source side select gate transistor STSb that are connected between the memory string MS and the source contact LI. Connected to a control gate of the source side select gate transistor STS is a source side select gate line SGS. In addition, connected to a control gate of the lowermost layer source side select gate transistor STSb is a lowermost layer source side select gate line SGSb. Moreover, in the example shown in FIG. 2, the source side select gate line SGS is commonly connected to all of the source side select gate transistors STS in the memory block MB. Similarly, the lowermost layer source side select gate line SGSb is commonly connected to all of the lowermost layer source side select gate transistors STSb in the memory block MB. The row control circuit 3 connects all of the memory strings MS in the memory block MB to the source line SL, based on an inputted signal.

Figure 3:
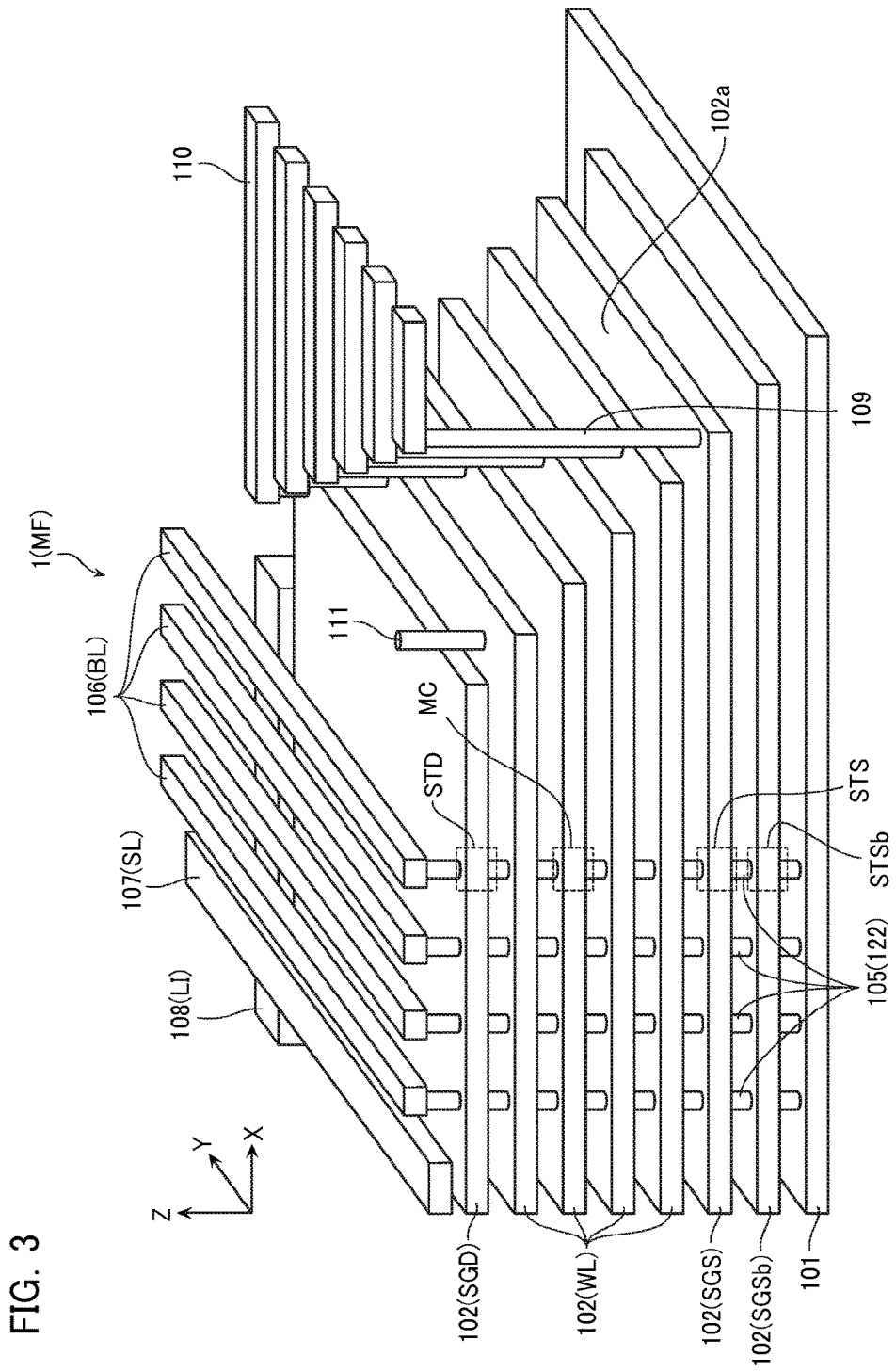
FIG. 3 is a perspective view showing a configuration of part of the same nonvolatile semiconductor memory device.

Next, a schematic configuration of the memory cell array 1 will be described with reference to FIG. 3. FIG. 3 is a schematic perspective view showing a configuration of part of the memory finger MF. Note that in FIG. 3, part of the configuration is omitted. Moreover, the configuration shown in FIG. 3 is merely an example, and a specific configuration may be appropriately changed.

As shown in FIG. 3, the memory finger MF comprises: a substrate 101; and a plurality of conductive layers 102 stacked in a Z direction on the substrate 101. In addition, the memory finger MF includes a plurality of memory columnar bodies 105 extending in the Z direction. As shown in FIG. 3, an intersection of the conductive layer 102 and the memory columnar body 105 functions as the lowermost layer source side select gate transistor STSb, the source side select gate transistor STS, the memory cell MC, or the drain side select gate transistor STD. The conductive layer 102 is configured from a conductive layer of the likes of tungsten (W) or polysilicon, for example, and functions as each of the word line WL and control gate electrode of the memory cell MC, the source side select gate line SGS and control gate electrode of the source side select gate transistor STS, the drain side select gate line SGD and control gate electrode of the drain side select gate transistor STD, or the lowermost layer source side select gate line SGSb and control gate electrode of the lowermost layer source side select gate transistor STSb.

As shown in FIG. 3, the plurality of conductive layers 102 are formed in steps, at their ends in an X direction. That is, the conductive layer 102 comprises a contact portion 102a that does not face a lower surface of the conductive layer 102 positioned in a layer above it. Moreover, the conductive layer 102 is connected to a via contact wiring line 109 at this contact portion 102a. Moreover, a wiring line 110 is provided at an upper end of the via contact wiring line 109. Note that the via contact wiring line 109 and the wiring line 110 are configured from a conductive layer of the likes of tungsten.

In addition, as shown in FIG. 3, the memory finger MF comprises a support 111. The support 111 communicates with holes provided in the plurality of conductive layers 102. The support 111 supports a posture of an unillustrated insulating layer provided between the conductive layers 102, in a manufacturing step.

In addition, as shown in FIG. 3, the memory finger MF comprises a conductive layer 108. The conductive layer 108 faces side surfaces in a Y direction of the plurality of conductive layers 102, and has a plate-like shape extending in the X direction and the Z direction. Moreover, a lower end of the conductive layer 108 contacts the substrate 101. The conductive layer 108 is configured from a conductive layer of the likes of tungsten (W), for example, and functions as the source contact LI.

In addition, as shown in FIG. 3, the memory finger MF comprises a plurality of conductive layers 106 and a conductive layer 107 that are positioned above the plurality of conductive layers 102 and memory columnar bodies 105, are arranged in plurality in the X direction, and extend in the Y direction. The memory columnar bodies 105 are respectively connected to lower surfaces of the conductive layers 106. The conductive layer 106 is configured from a conductive layer of the likes of tungsten (W), for example, and functions as the bit line BL. Moreover, the conductive layer 108 is connected to a lower surface of the conductive layer 107. The conductive layer 107 is configured from a conductive layer of the likes of tungsten (W), for example, and functions as the source line SL.

Figure 4:
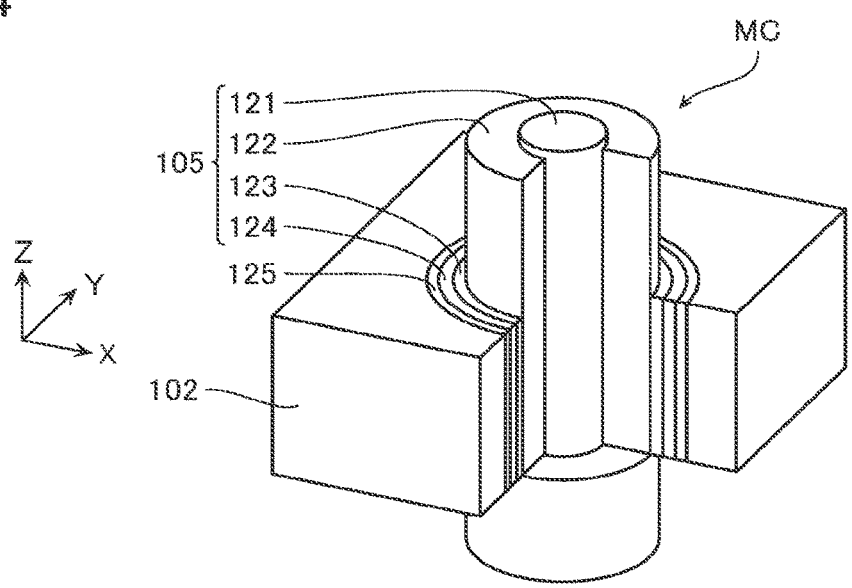
FIG. 4 is a perspective view showing a configuration of part of the same nonvolatile semiconductor memory device.

Next, a schematic configuration of the memory cell MC will be described with reference to FIG. 4. FIG. 4 is a schematic perspective view showing the configuration of the memory cell MC. Note that in FIG. 4, part of the configuration is omitted.

As shown in FIG. 4, the memory cell MC is provided at an intersection of the conductive layer 102 and the memory columnar body 105. The memory columnar body 105 comprises: a core insulating layer 121; and a semiconductor layer 122, a tunnel insulating layer 123, and a charge accumulation layer 124 that are stacked on a sidewall of the core insulating layer 121. Furthermore, a block insulating layer 125 is provided between the memory columnar body 105 and the conductive layer 102.

The core insulating layer 121 is configured from an insulating layer of the likes of silicon oxide ($SiO_2$), for example. The semiconductor layer 122 is configured from a semiconductor layer of the likes of polysilicon, for example, and functions as a channel of the memory cell MC and the drain side select gate transistor STD. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride (SiN), for example. The block insulating layer 125 is configured from an insulating layer of the likes of silicon oxide ($SiO_2$), for example.

Figure 5:
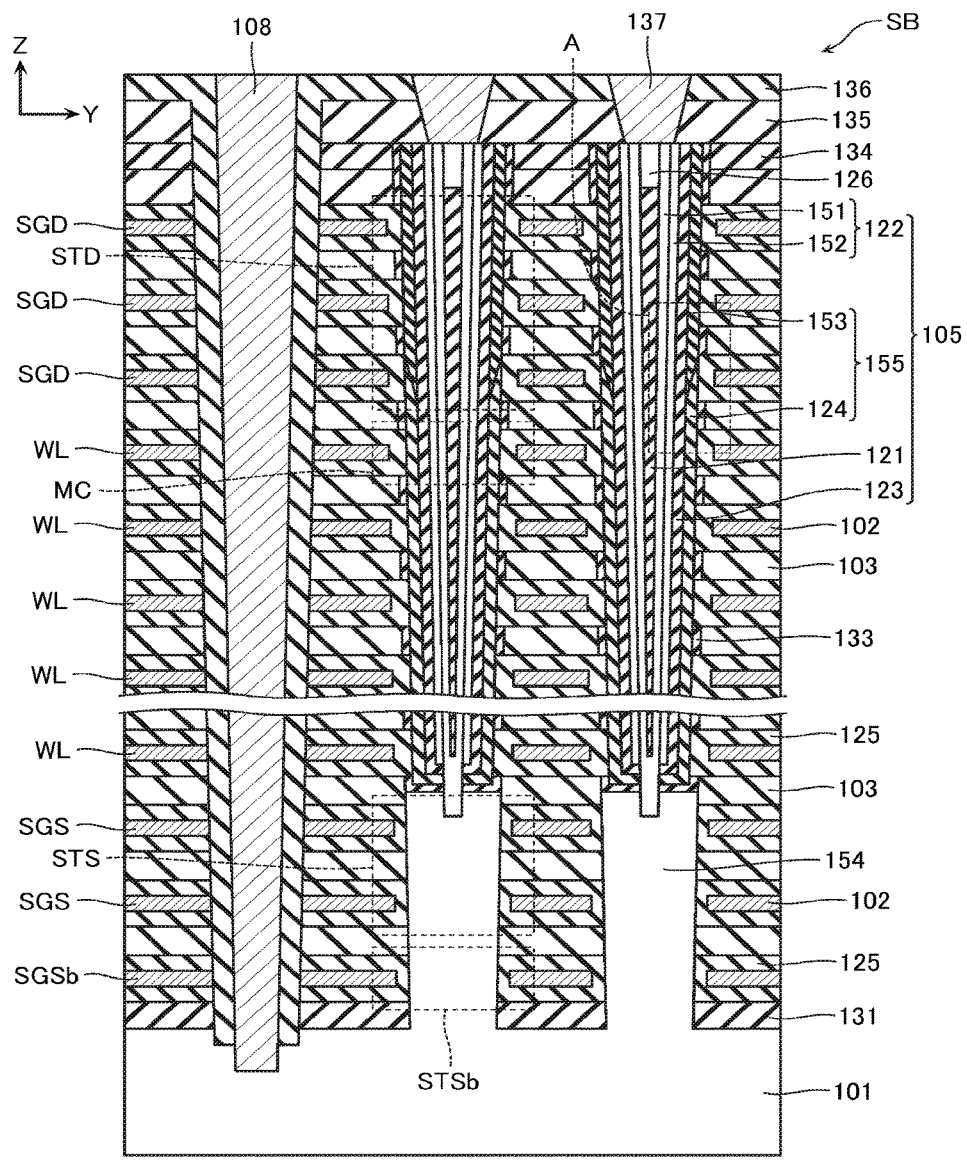
FIG. 5 is a cross-sectional view showing a configuration of part of the same nonvolatile semiconductor memory device.

Next, the nonvolatile semiconductor memory device according to the present embodiment will be described in more detail with reference to FIG. 5. FIG. 5 is a cross-sectional view showing a configuration of part of the same nonvolatile semiconductor memory device.

As shown in FIG. 5, the nonvolatile semiconductor memory device according to the present embodiment comprises: the substrate 101; and a stacked body SB, the memory columnar body 105, and the conductive layer 108 provided on the substrate 101. The stacked body SB includes a plurality of the conductive layers 102 stacked above the substrate 101. These plurality of conductive layers 102 each function as the control gate of the memory cell MC and the word line WL, or the like. The memory columnar body 105 includes the semiconductor layer 122 extending in the Z direction perpendicular to the substrate 101. This semiconductor layer 122 functions as the channel body of the memory cell MC, and so on. The conductive layer 108 functions as the source contact LI.

Next, the stacked body SB will be described with reference to FIG. 5. The stacked body SB comprises a plurality of the conductive layers 102 and inter-layer insulating layers 103 provided alternately above the substrate 101. In addition, the stacked body SB comprises the block insulating layer 125 that covers an upper surface, lower surface, and side surface of the conductive layer 102. The conductive layer 102 is formed from a conductive material of the likes of tungsten (W), for example, and functions as the control gate of the memory cell MC and the word line WL, or the like. Moreover, the inter-layer insulating layer 103 and the block insulating layer 125 are formed from an insulating material of the likes of silicon oxide ($SiO_2$), for example.

Next, the memory columnar body 105 will be described with reference to FIG. 5. As shown in FIG. 5, the memory columnar body 105 comprises: the core insulating layer 121 extending in the Z direction; and the semiconductor layer 122, the tunnel insulating layer 123, and the charge accumulation layer 124 that sequentially cover the sidewall of the core insulating layer 121. Moreover, the semiconductor layer 122 comprises: a first semiconductor layer 151 covering a side surface of the core insulating layer 121; and a second semiconductor layer 152 covering a side surface of this first semiconductor layer 151. The core insulating layer 121 is formed from an insulating material of the likes of silicon oxide ($SiO_2$), for example. The first semiconductor layer 151 and the second semiconductor layer 152 are formed from a semiconductor of the likes of polysilicon, for example, and function as the channel body of the memory cell MC, and so on. The tunnel insulating layer 123 is formed from an insulating layer of the likes of silicon oxide ($SiO_2$), for example. The charge accumulation layer 124 is formed from an insulating layer capable of accumulating a charge, of the likes of silicon nitride (SiN), for example.

As shown in FIG. 5, the core insulating layer 121 has a columnar shape extending in the Z direction. Moreover, the sidewall of the core insulating layer 121 is covered by the semiconductor layer 122, the tunnel insulating layer 123, and the charge accumulation layer 124.

Now, as shown in FIG. 5, in the present embodiment, the semiconductor layer 122 and the tunnel insulating layer 123 cover all of the sidewall from an upper end to a lower end of the core insulating layer 121. In contrast, the charge accumulation layer 124 covers only the sidewall from the lower end to a certain height of the core insulating layer 121. Furthermore, in the present embodiment, an oxide layer 153 is provided upwardly of the charge accumulation layer 124, and this oxide layer 153 covers the sidewall of the core insulating layer 121 in a range from an upper end of the charge accumulation layer 124 to the upper end of the core insulating layer 121. Note that the oxide layer 153 is configured from an insulating layer of the likes of silicon oxide ($SiO_2$), for example.

As shown in FIG. 5, the charge accumulation layer 124 and the oxide layer 153 are formed integrally, and configure a first insulating layer 155. In other words, part of the first insulating layer 155 is the charge accumulation layer 124, and part of the first insulating layer 155 is the oxide layer 153. The first insulating layer 155 covers all of the sidewall from the upper end to the lower end of the core insulating layer 121, via the semiconductor layer 122 and the tunnel insulating layer 123. Note that a boundary of the charge accumulation layer 124 and the oxide layer 153 is positioned more upwardly than the word line WL positioned in an uppermost layer, and is positioned more downwardly than an upper surface of the drain side select gate line SGD positioned in an uppermost layer.

Note that as shown in FIG. 5, part of the memory columnar body 105 is covered by a cover insulating layer 133. That is, as shown in FIG. 5, the cover insulating layer 133 covers a sidewall of part of the charge accumulation layer 124. Note that the cover insulating layer 133 is configured from an insulating layer of the likes of silicon oxide ($SiO_2$), for example.

In addition, as shown in FIG. 5, the memory columnar body 105 comprises a semiconductor layer 154. The semiconductor layer 154 is formed integrally with the substrate 101 and extends in the Z direction. The semiconductor layer 154 is formed from the likes of monocrystalline silicon, for example, and functions as the channel body of the source side select gate transistor STS and the lowermost layer source side select gate transistor STSb. The first semiconductor layer 151 is connected to an upper portion of the semiconductor layer 154.

Now, as described with reference to FIG. 5, in the semiconductor memory device according to the present embodiment, the upper end of the charge accumulation layer 124 is positioned more downwardly than the upper surface of the drain side select gate line SGD positioned in an uppermost layer. Therefore, an influence exerted on characteristics of the drain side select gate transistor STD by the charge accumulation layer 124 is more suppressed compared to when, for example, an entire side surface of the semiconductor layer 122 is covered by the charge accumulation layer 124. That is, fluctuation of threshold voltage of the drain side select gate transistor STD is suppressed.

Moreover, as described with reference to FIG. 5, in the semiconductor memory device according to the present embodiment, part of the first insulating layer 155 is the charge accumulation layer 124, and part of the first insulating layer 155 is the oxide layer 153. Such a semiconductor memory device is achievable by oxidizing an upper portion of the charge accumulation layer 124. Therefore, the semiconductor memory device according to the present embodiment can be manufactured comparatively easily.

Figure 6:
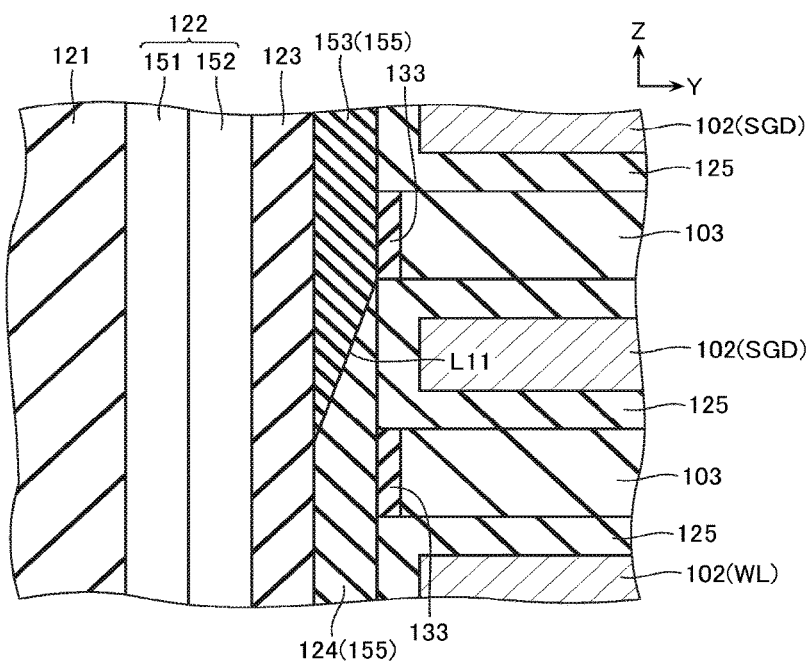
FIG. 6 is a cross-sectional view showing a configuration of part of the same nonvolatile semiconductor memory device.

Next, a boundary portion of the charge accumulation layer 124 and the oxide layer 153 will be described with reference to FIG. 6. FIG. 6 is a cross-sectional view showing a configuration of part of the nonvolatile semiconductor memory device according to the first embodiment, and shows an enlarged view of the portion indicated by A of FIG. 5.

As shown in FIG. 6, provided on a side surface of the core insulating layer 121 are the semiconductor layer 122, the tunnel insulating layer 123, and the first insulating layer 155. Moreover, an upper portion of the first insulating layer 155 is the oxide layer 153, and a lower portion is the charge accumulation layer 124.

Shown in FIG. 6 is a boundary line L11 of the oxide layer 153 and the charge accumulation layer 124. As shown in FIG. 6, the boundary line L11 is inclined so as to be positioned more downwardly the closer its position is to the semiconductor layer 122, and more upwardly the closer its position is to the conductive layer 102. Moreover, a lower end of the boundary line L11 is positioned more upwardly than the uppermost layer word line WL. On the other hand, the upper end of the boundary line L11 is positioned more downwardly than the upper surface of the uppermost layer drain side select gate line SGD.

Now, as described with reference to FIG. 5, in the semiconductor memory device according to the present embodiment, part of the first insulating layer 155 is the charge accumulation layer 124, and part of the first insulating layer 155 is the oxide layer 153. Such a configuration is achievable by, for example, oxidizing the upper portion of the charge accumulation layer 124. However, in such a case, sometimes, variation ends up occurring in a degree of progression of oxidation, according to, for example, a position on a wafer, and so on. In this case, as indicated by, for example, lines L12 and L13 in FIG. 7, sometimes, variation occurs in height of the boundary line of the charge accumulation layer 124 and the oxide layer 153, and variation ends up occurring also in characteristics of the drain side select gate transistor STD.

Now, as described with reference to FIG. 6, in the nonvolatile semiconductor memory device according to the present embodiment, the boundary line L11 of the oxide layer 153 and the charge accumulation layer 124 is inclined. Therefore, even when variation occurs in height of the boundary line L11, fluctuation of an amount of the charge accumulation layer 124 included in the drain side select gate transistor STD can be more suppressed compared to when, for example, the boundary line L11 is not inclined. This makes it possible for variation in characteristics of the drain side select gate transistor STD to be suppressed.

Figure 7:
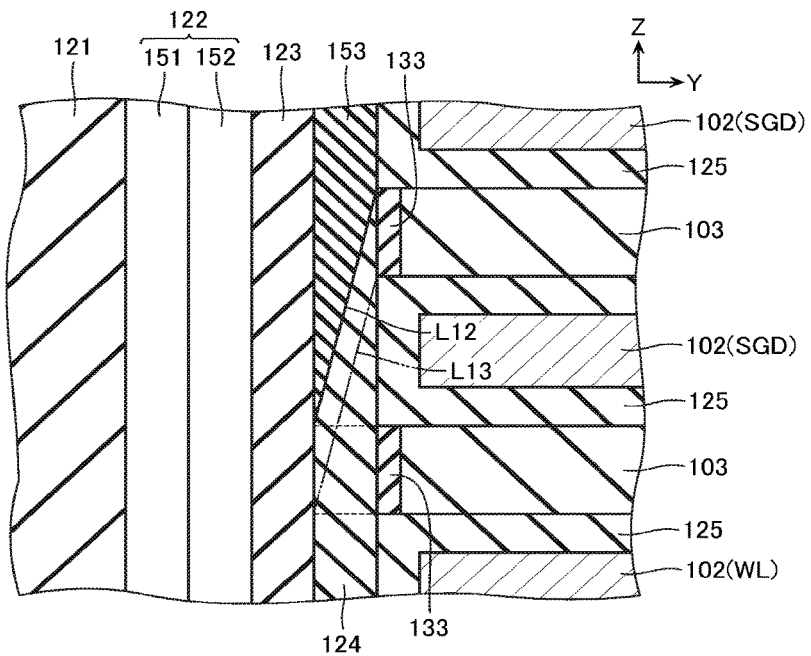
FIG. 7 is a cross-sectional view showing a configuration of a modified example of the same nonvolatile semiconductor memory device.
Figure 8:
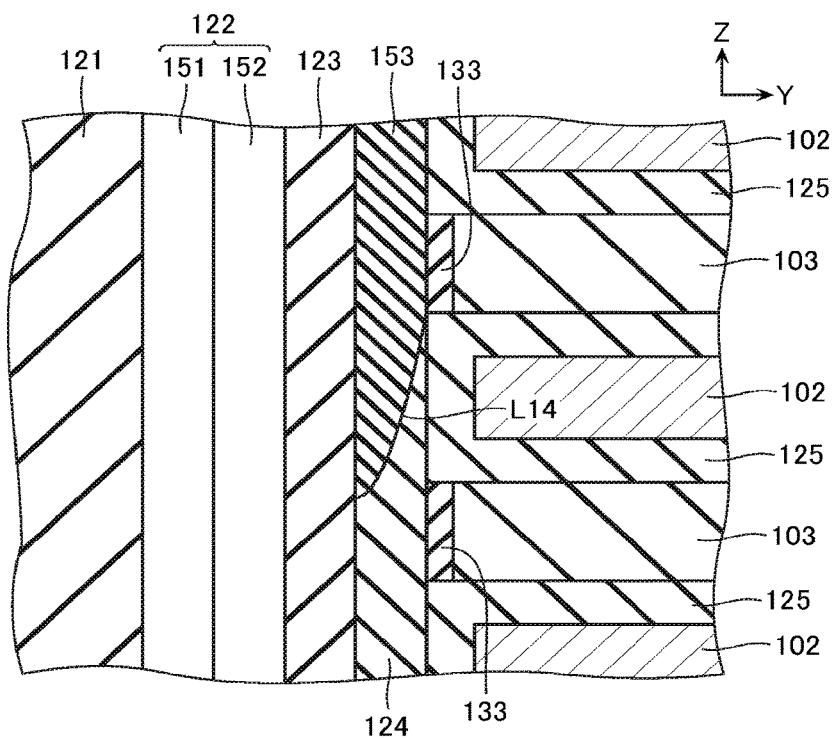
FIG. 8 is a cross-sectional view showing a configuration of a modified example of the same nonvolatile semiconductor memory device.

Note that FIGS. 6 and 7 show examples where the boundary lines L11, L12, and L13 of the oxide layer 153 and the charge accumulation layer 124 are straight lines, but as indicated by a line L14 in FIG. 8, the boundary line of the oxide layer 153 and the charge accumulation layer 124 may be a curved line.

Moreover, as shown in FIG. 7, a width in the Z direction of the boundary line L12 maybe about a pitch in the Z direction of the conductive layers 102 (a distance from an upper surface of a certain conductive layer 102 to an upper surface of another conductive layer 102 positioned one layer above the certain conductive layer 102).

[Method of Manufacturing]

Figure 9:
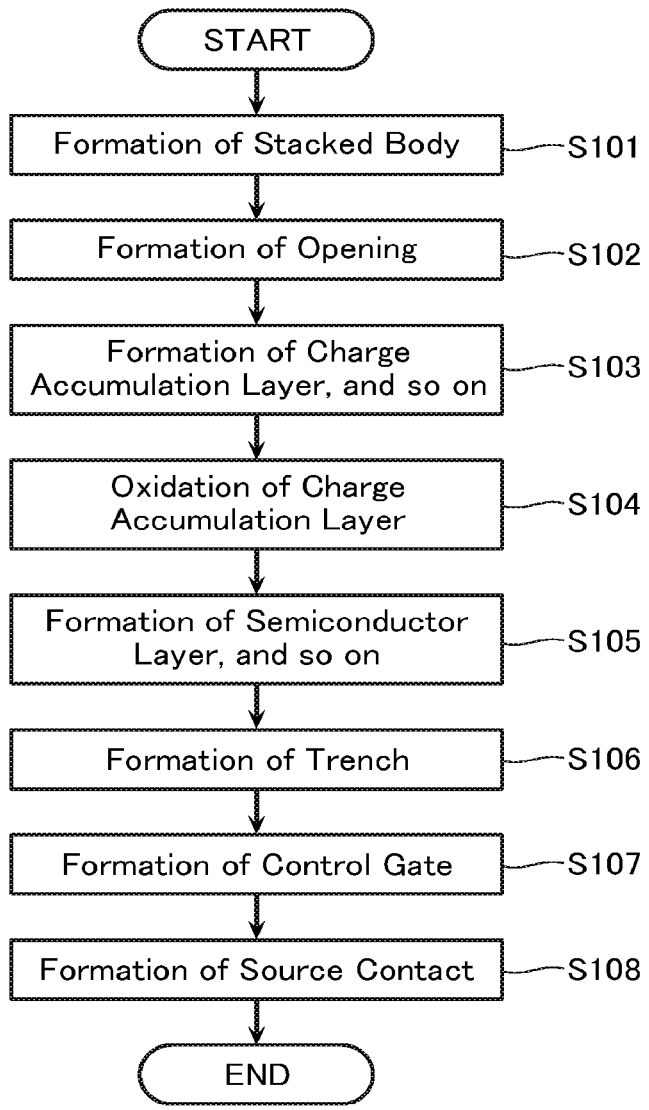
FIG. 9 is a flowchart showing a method of manufacturing the same nonvolatile semiconductor memory device.

Next, a method of manufacturing the nonvolatile semiconductor memory device according to the first embodiment will be described with reference to FIGS. 9 to 28. FIG. 9 is a flowchart for explaining the same method of manufacturing. FIGS. 10 to 28 are cross-sectional views for explaining the same method of manufacturing.

Figure 10:
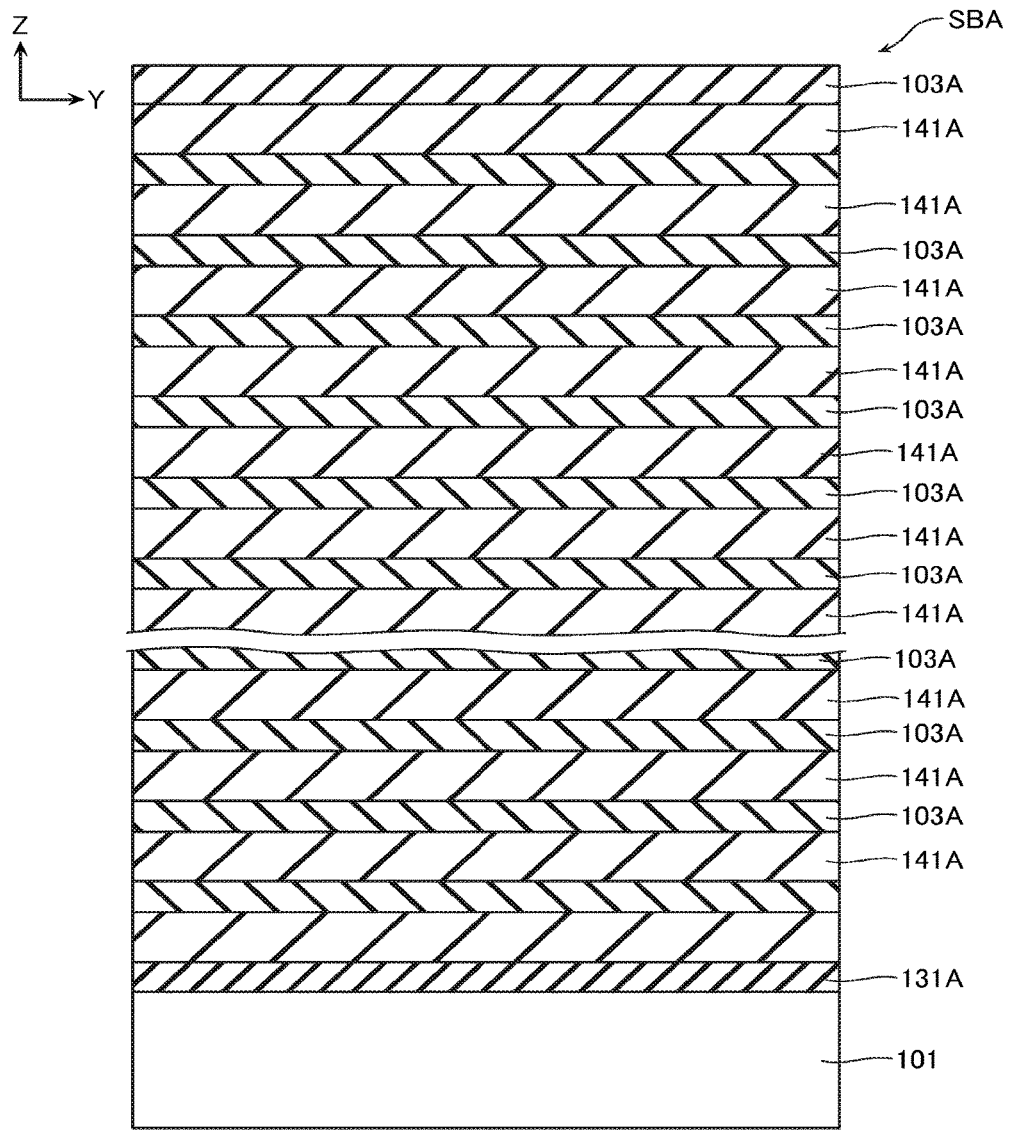
FIG. 10 is a cross-sectional view showing the same method of manufacturing.

As shown in FIGS. 9 and 10, in step S101, an insulating layer 131A is stacked above the substrate 101, and a plurality of layers of insulating layers 103A which will be the inter-layer insulating layers 103, and sacrifice layers 141A are alternately stacked to form a stacked body SBA. The insulating layer 131A and the insulating layer 103A are formed from silicon oxide ($SiO_2$), for example. Moreover, the sacrifice layer 141A is formed from silicon nitride (SiN), for example.

Figure 11:
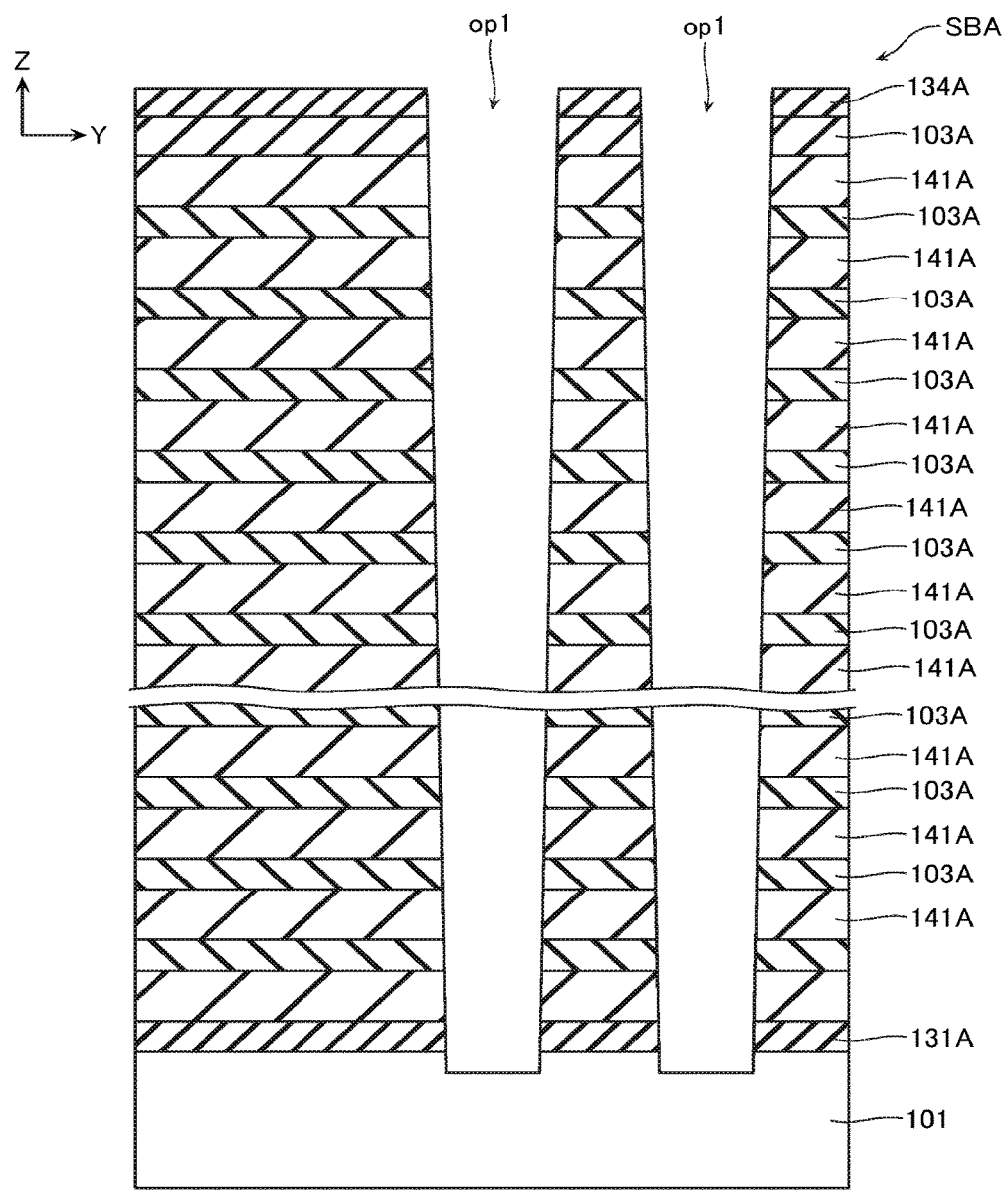
FIG. 11 is a cross-sectional view showing the same method of manufacturing.
Figure 12:
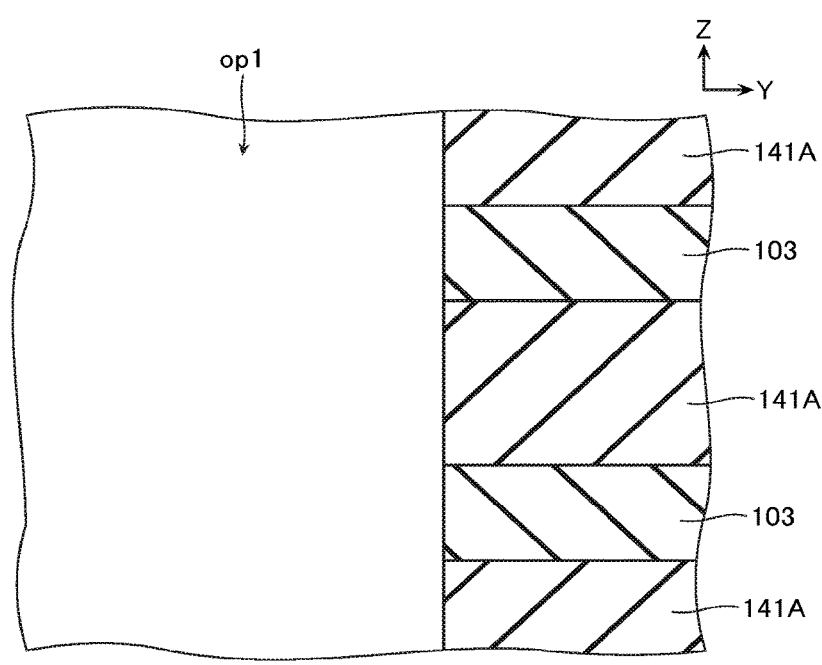
FIG. 12 is a cross-sectional view showing the same method of manufacturing.

As shown in FIGS. 9, 11, and 12, in step S102, an opening op1 is formed in the stacked body SBA. That is, first, an insulating layer 134A is formed on an upper surface of the stacked body SBA. A portion corresponding to the opening op1, of the insulating layer 134A is provided with an opening. Next, anisotropic etching such as RIE (Reactive Ion Etching) is performed using this insulating layer 134A as a mask, and the opening op1 is formed in the stacked body SBA. The opening op1 penetrates the insulating layer 131A and the plurality of insulating layers 103A and sacrifice layers 141A stacked in a layer above the insulating layer 131A.

As shown in FIG. 9 and FIGS. 13 to 15, in step S103, the charge accumulation layer 124, and so on, are formed in the opening op1.

Figure 13:
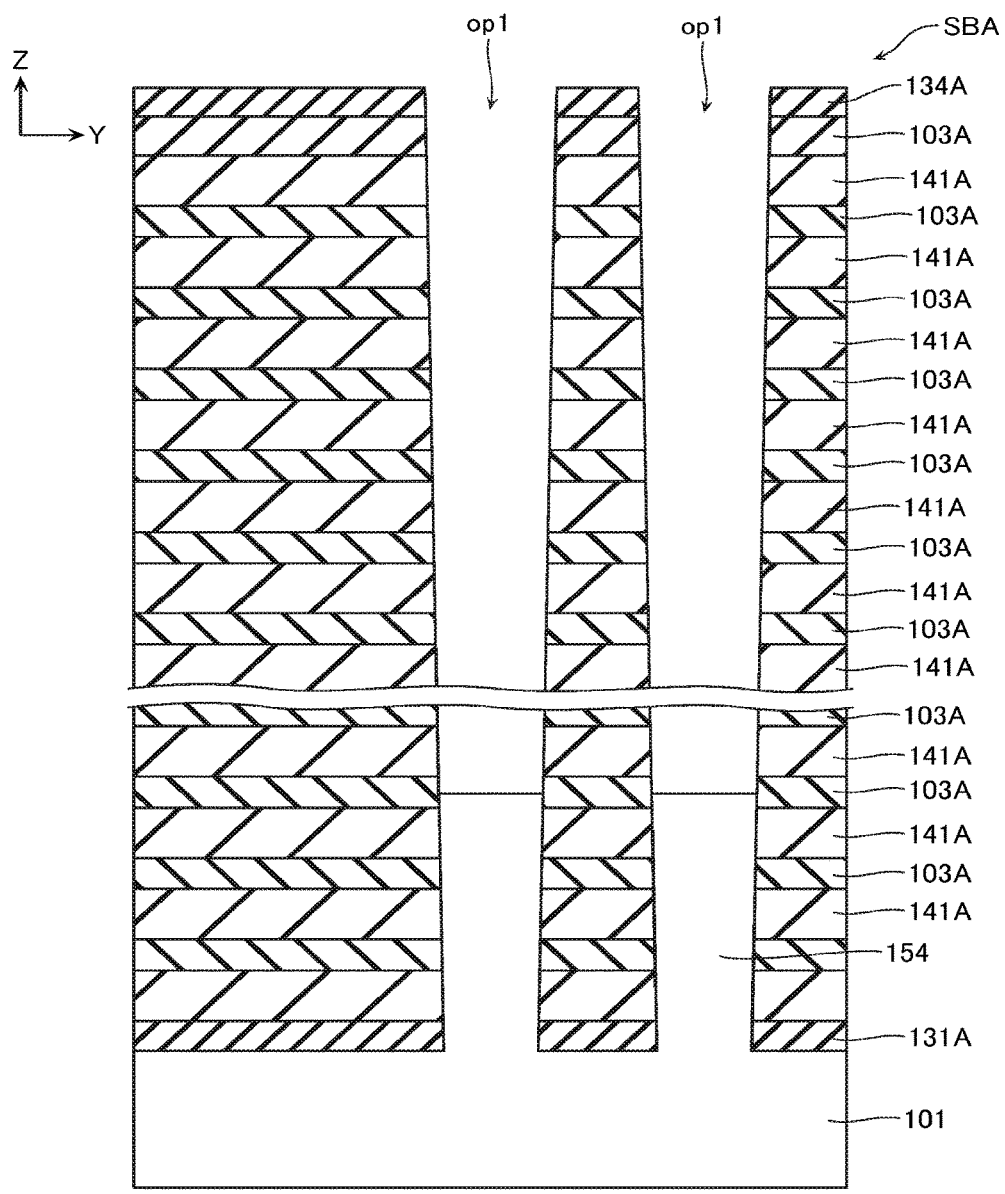
FIG. 13 is a cross-sectional view showing the same method of manufacturing.

That is, first, as shown in FIG. 13, the semiconductor layer 154 is formed in the opening op1. The semiconductor layer 154 can be formed by, for example, a crystal growing method such as epitaxial growth. This case results in the semiconductor layer 154 being formed from monocrystalline silicon formed integrally with the substrate 101, for example.

Figure 14:
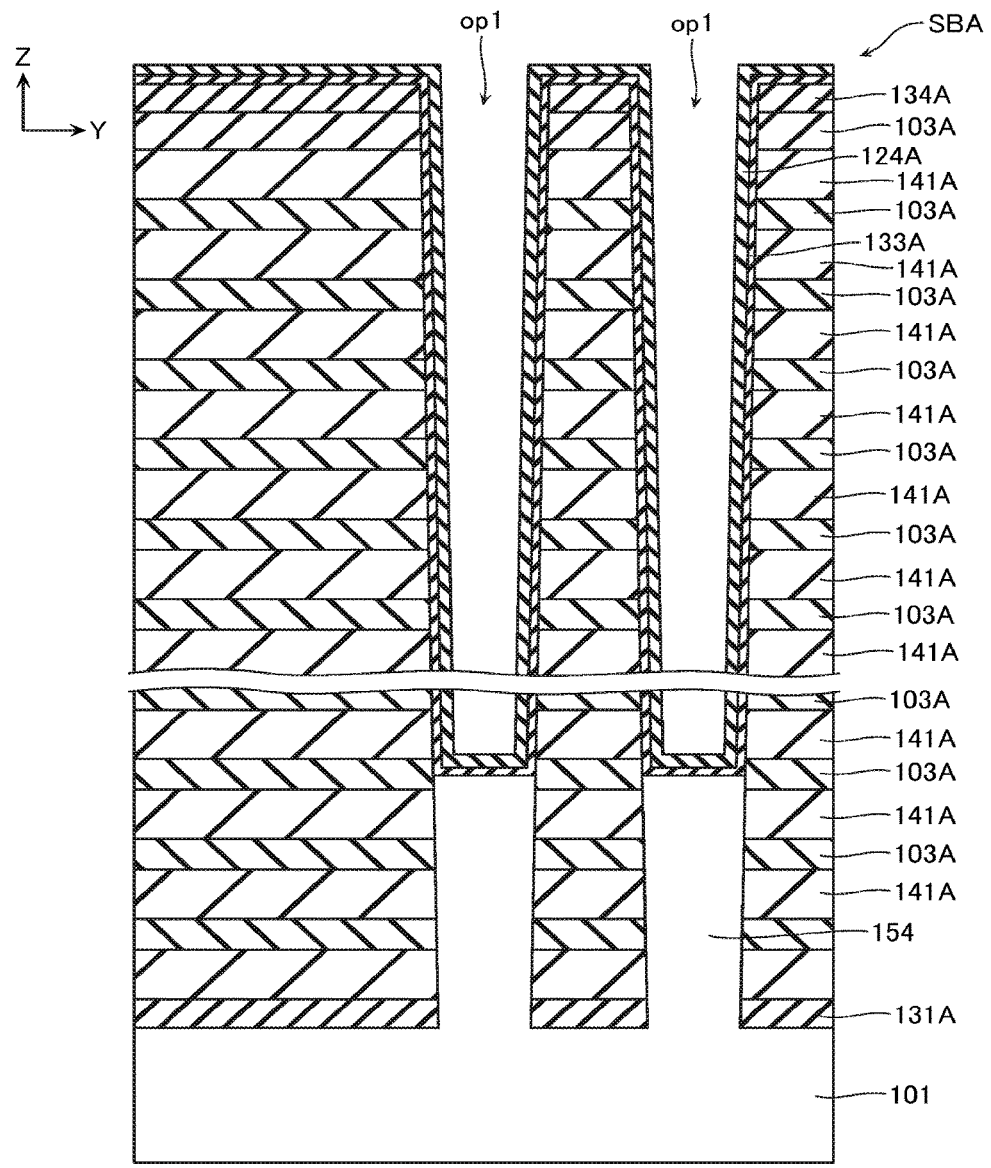
FIG. 14 is a cross-sectional view showing the same method of manufacturing.
Figure 15:
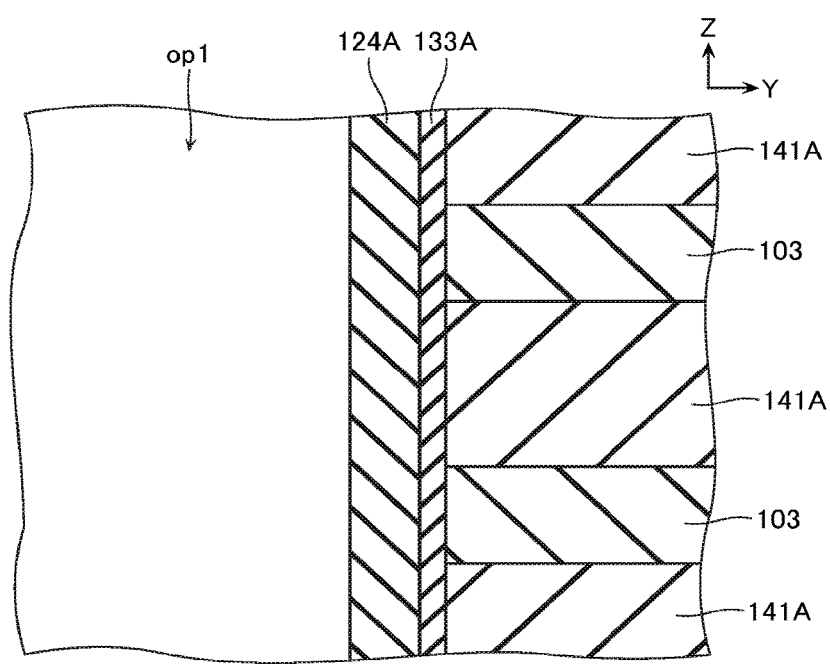
FIG. 15 is a cross-sectional view showing the same method of manufacturing.

Next, as shown in FIGS. 14 and 15, an insulating layer 133A which will be the cover insulating layer 133 and a charge accumulation layer 124A which will be the charge accumulation layer 124 are formed on an inner wall and bottom portion of the opening op1 and the upper surface of the stacked body SBA. The insulating layer 133A is formed from silicon oxide ($SiO_2$), for example. Moreover, the charge accumulation layer 124A is formed from silicon nitride (SiN), for example.

Figure 16:
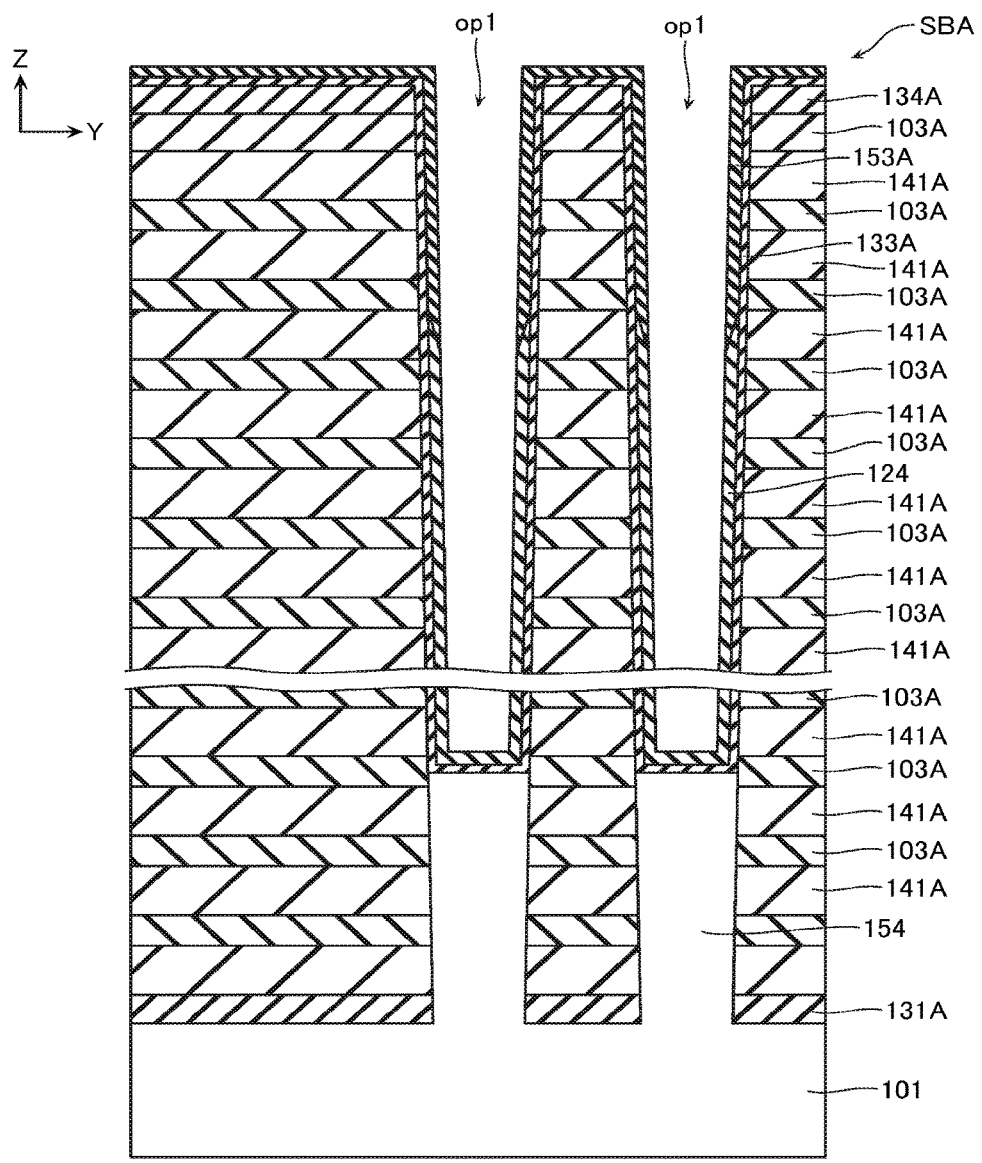
FIG. 16 is a cross-sectional view showing the same method of manufacturing.
Figure 17:
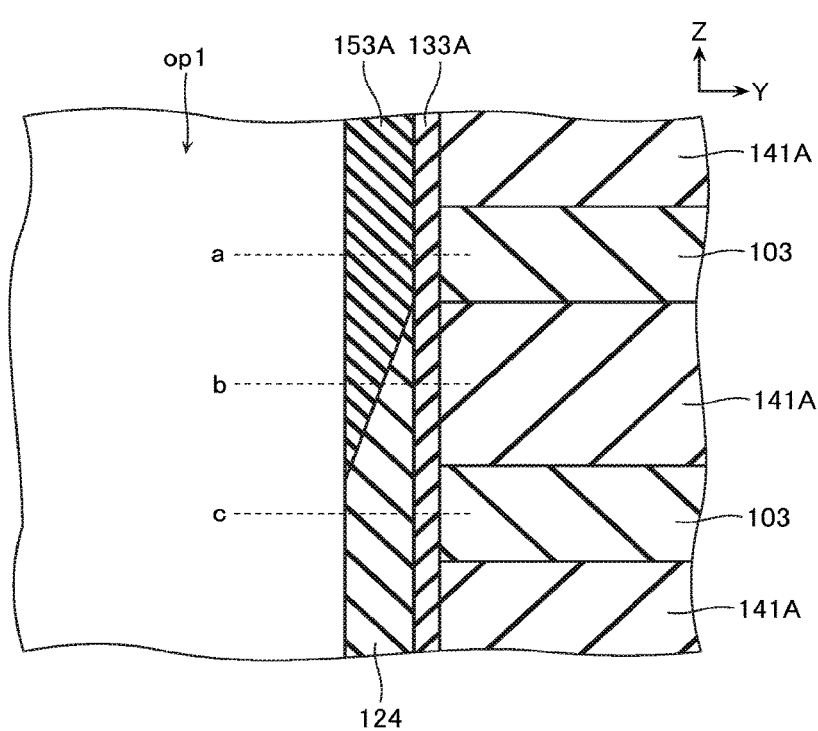
FIG. 17 is a cross-sectional view showing the same method of manufacturing.

As shown in FIGS. 9, 16, and 17, in step S104, an upper portion of the charge accumulation layer 124A is oxidized. As a result, the upper portion of the charge accumulation layer 124A becomes an oxide layer 153A, and a remaining portion becomes the charge accumulation layer 124. Oxidation of the charge accumulation layer 124A is performed employing a method capable of selectively oxidizing only the upper portion of the charge accumulation layer 124A, such as a plasma oxidation method, for example.

As shown in FIG. 9 and FIGS. 18 to 24, in step S105, the semiconductor layer 122, and so on, are formed in the opening op1.

Figure 18:
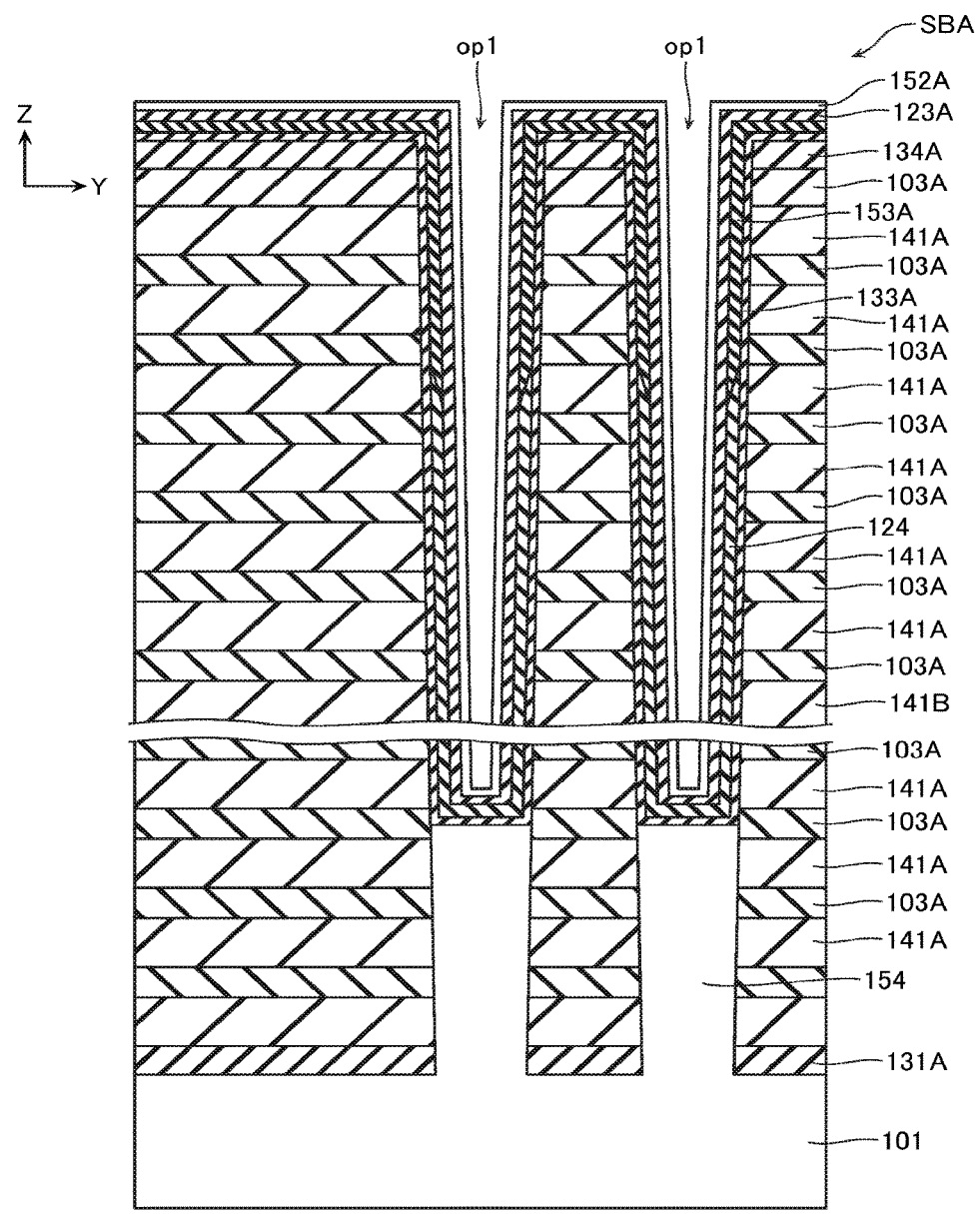
FIG. 18 is a cross-sectional view showing the same method of manufacturing.
Figure 19:
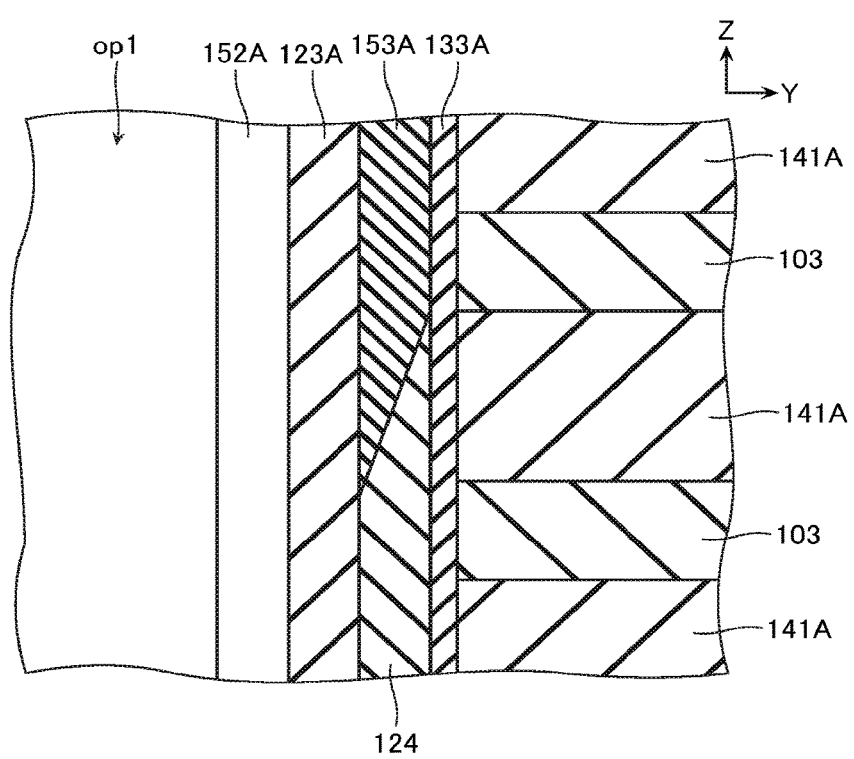
FIG. 19 is a cross-sectional view showing the same method of manufacturing.

That is, first, as shown in FIGS. 18 and 19, an insulating layer 123A forming the tunnel insulating layer 123 and a semiconductor layer 152A forming the second semiconductor layer 152 are formed on the inner wall and bottom portion of the opening op1 and the upper surface of the stacked body SBA. The insulating layer 123A is formed from silicon oxide ($SiO_2$), for example. Moreover, the semiconductor layer 152A is formed from amorphous-state silicon, for example.

Figure 20:
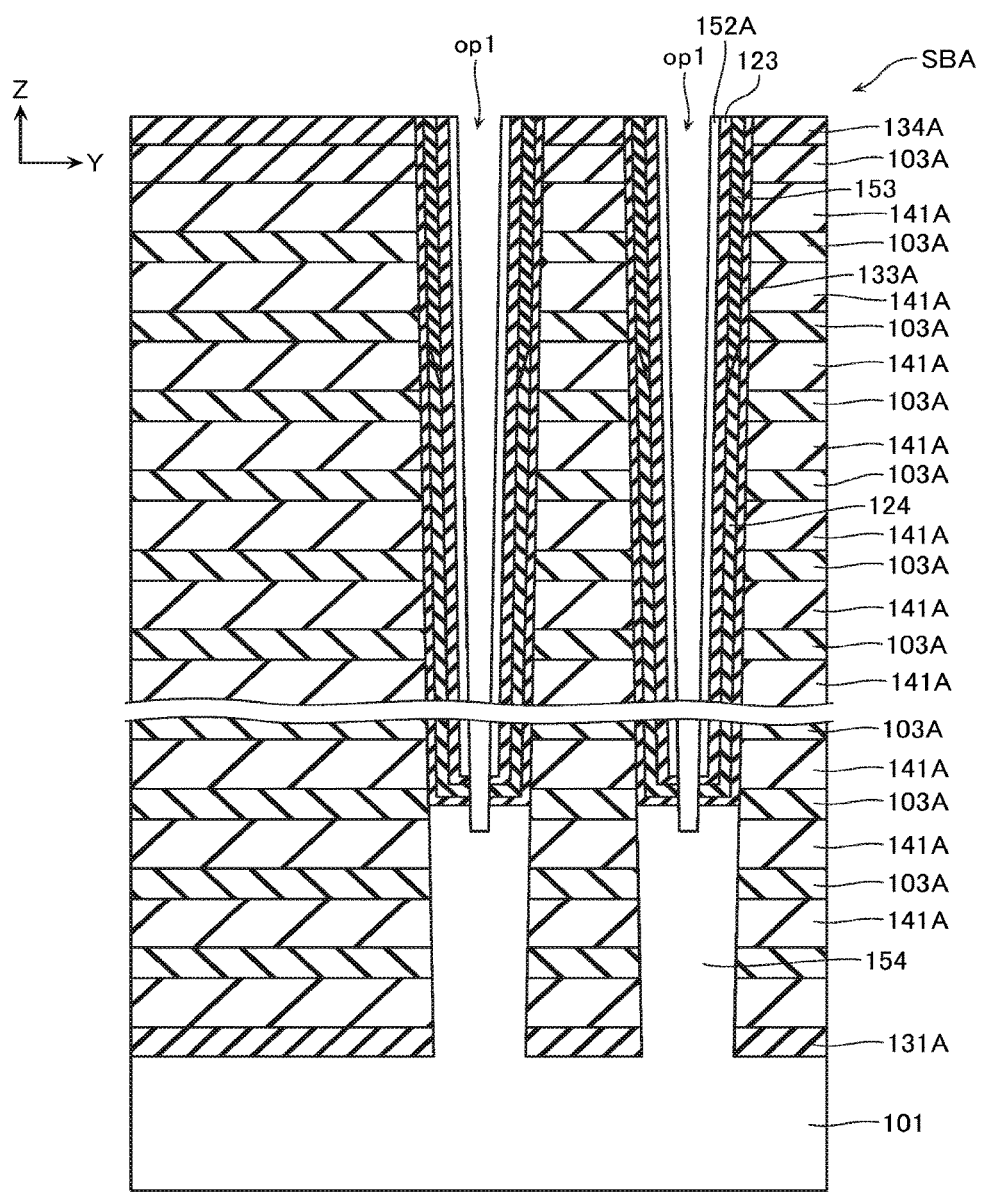
FIG. 20 is a cross-sectional view showing the same method of manufacturing.

Next, as shown in FIG. 20, parts of the insulating layer 133A, the charge accumulation layer 124A, the insulating layer 123A and the semiconductor layer 152A are removed to expose an upper surface of the semiconductor layer 154 and the upper surface of the stacked body SBA. As a result of this step, the tunnel insulating layer 123 and the oxide layer 153 are formed.

Figure 21:
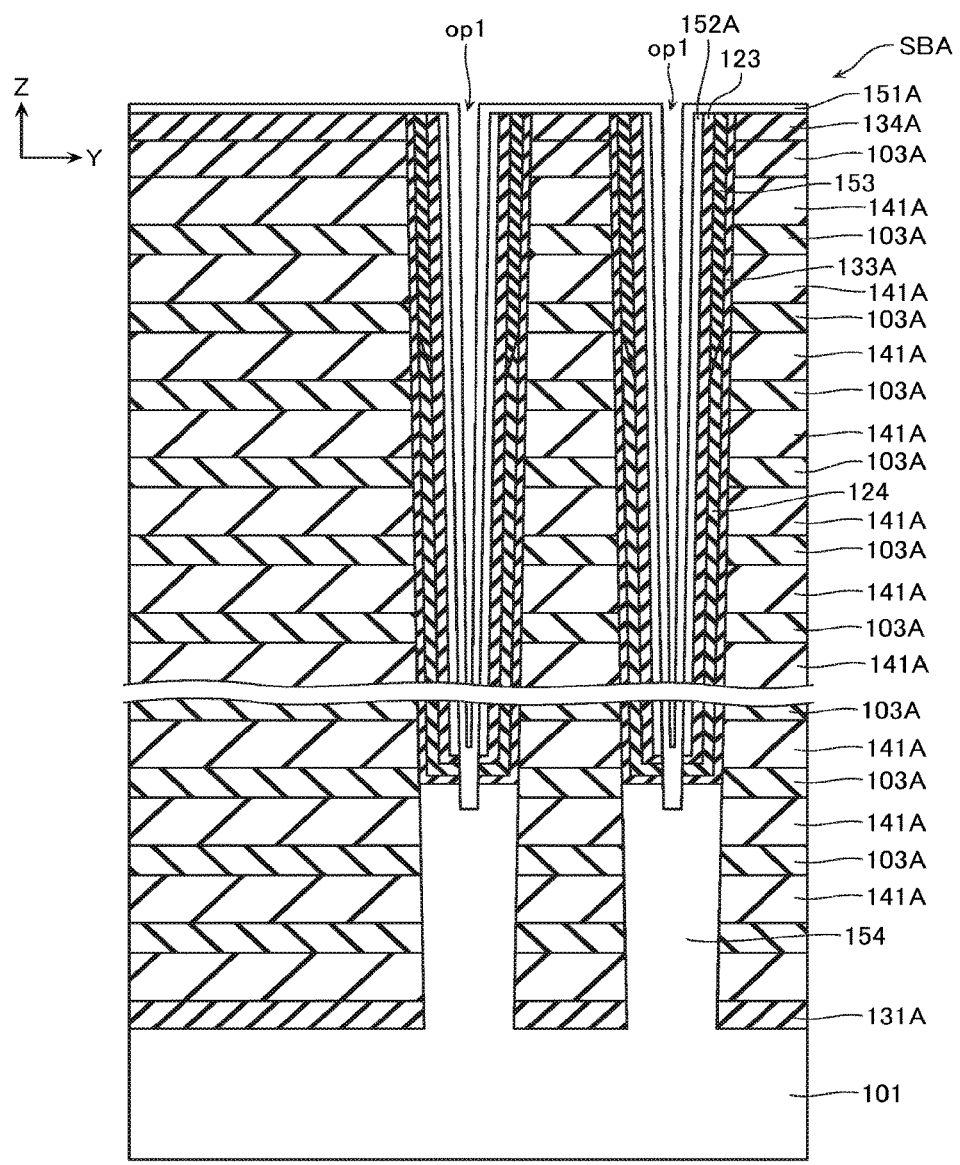
FIG. 21 is a cross-sectional view showing the same method of manufacturing.
Figure 22:
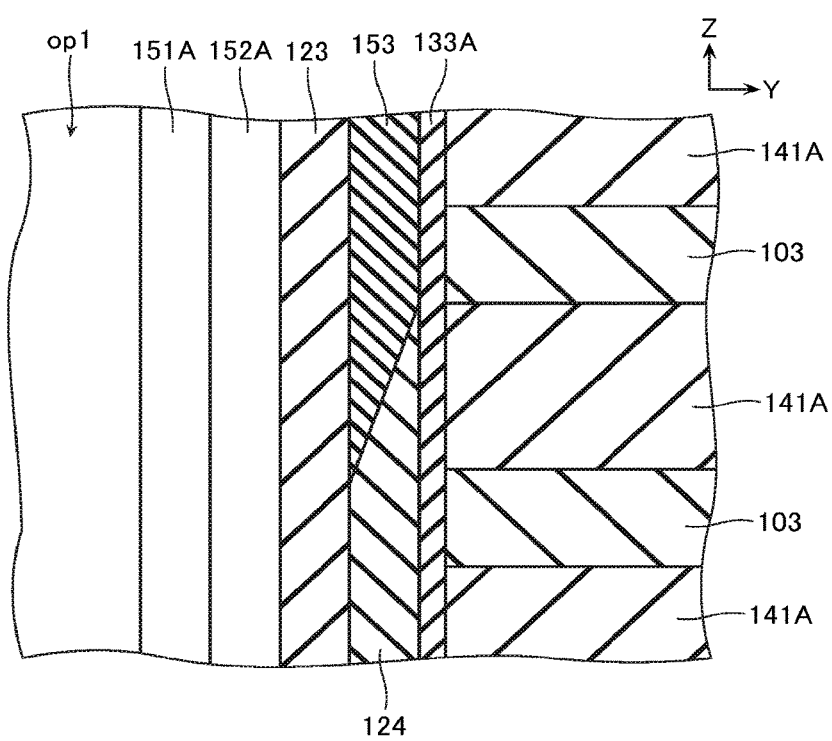
FIG. 22 is a cross-sectional view showing the same method of manufacturing.

Next, as shown in FIGS. 21 and 22, a semiconductor layer 151A forming the first semiconductor layer 151 is formed on the inner wall and bottom portion of the opening op1 and the upper surface of the stacked body SBA. The semiconductor layer 151A is formed from amorphous-state silicon, for example.

Figure 23:
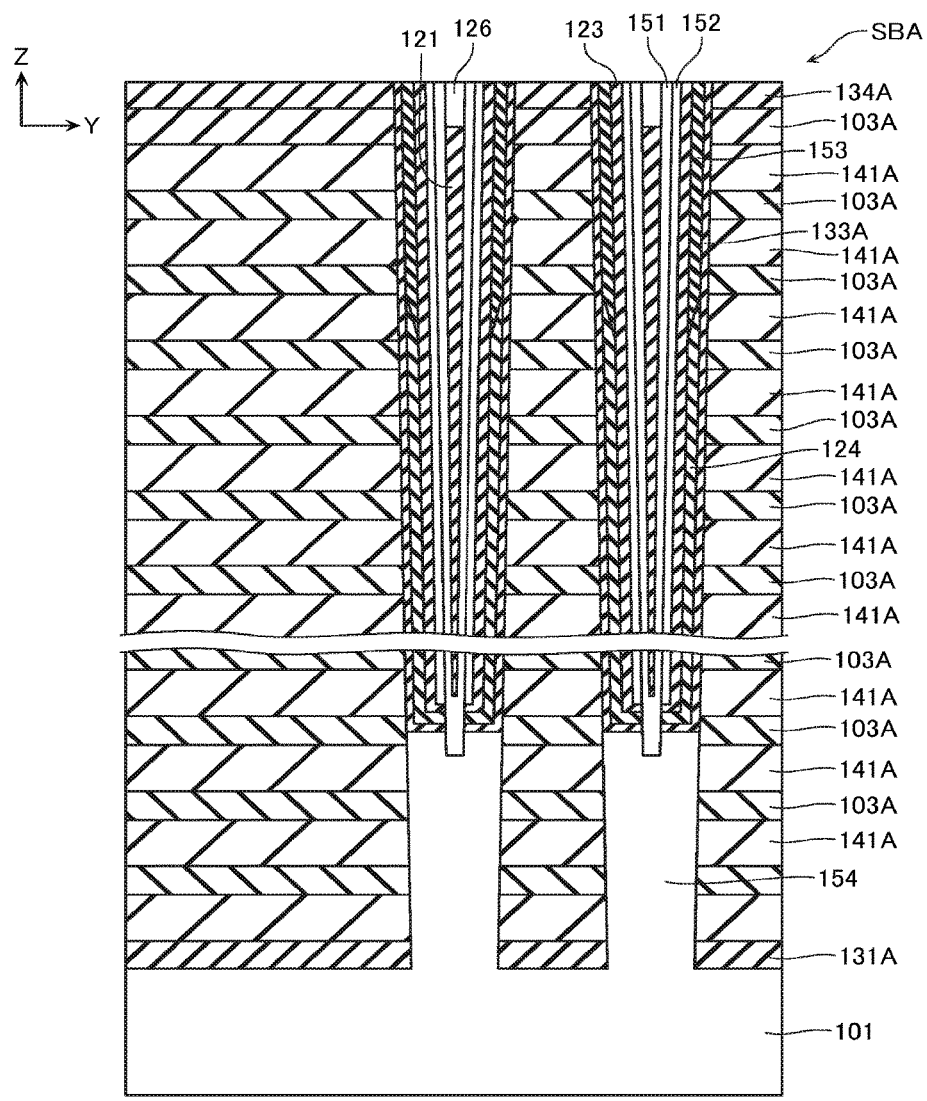
FIG. 23 is a cross-sectional view showing the same method of manufacturing.
Figure 24:
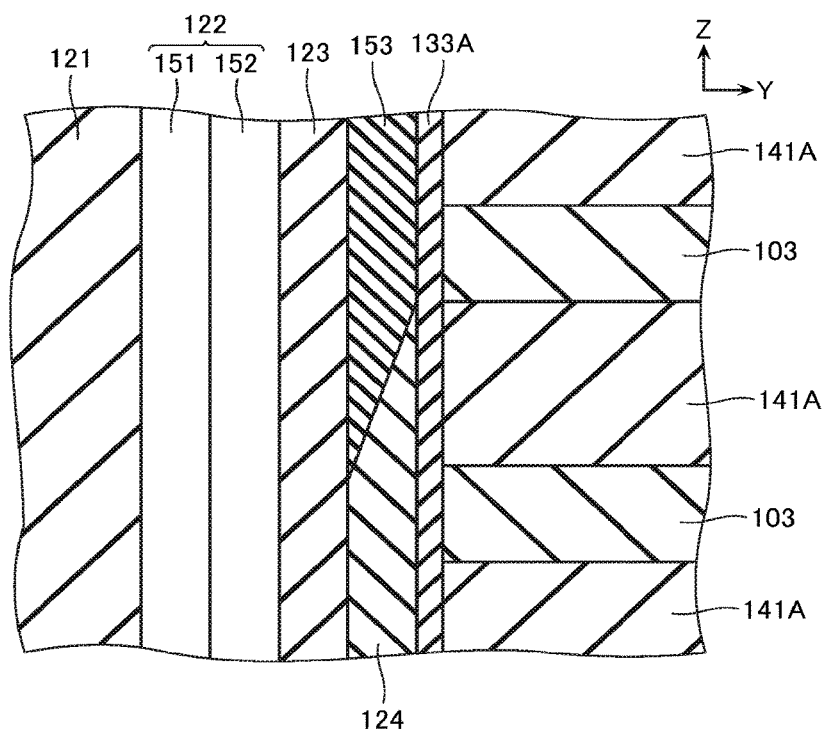
FIG. 24 is a cross-sectional view showing the same method of manufacturing.

Next, as shown in FIGS. 23 and 24, the core insulating layer 121 and a conductive layer 126 are implanted inside the opening op1, CMP (Chemical Mechanical Polishing) or the like is performed using the insulating layer 134A, and so on, as a stopper, and smoothing is performed. As a result, part of the semiconductor layer 151A is removed. In addition, heat treatment, and so on, is performed and a crystalline structure of the amorphous-state semiconductor layer 151A and semiconductor layer 152A is configured as a polycrystalline structure. As a result, the first semiconductor layer 151 and the second semiconductor layer 152 are formed.

Figure 25:
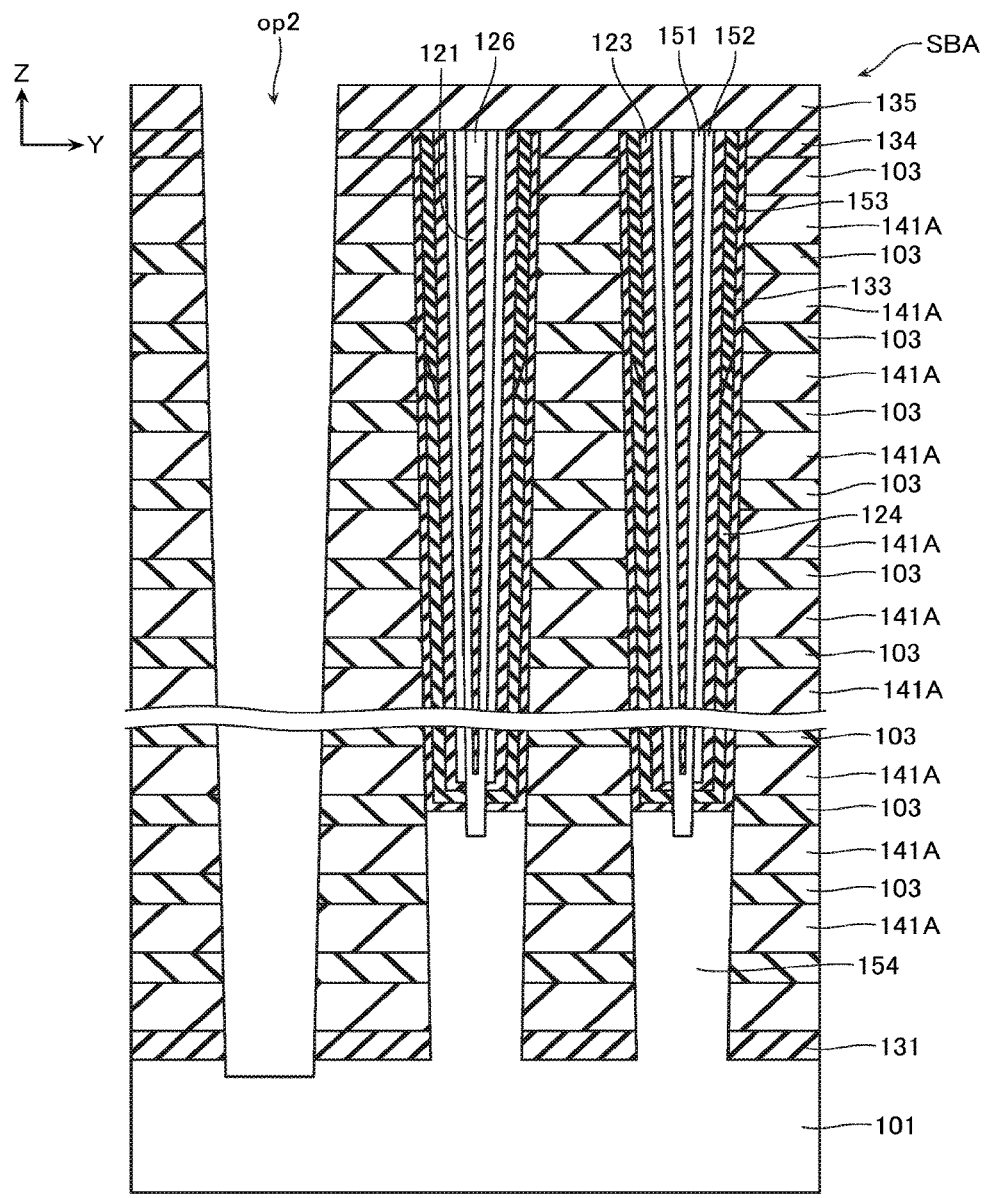
FIG. 25 is a cross-sectional view showing the same method of manufacturing.

As shown in FIGS. 9 and 25, in step S106, a trench op2 that divides at least part of the stacked body SBA, is formed. For example, first, as shown in FIG. 25, an insulating layer 135 is formed on the upper surface of the stacked body SBA. A portion corresponding to the trench op2, of the insulating layer 135 is provided with a trench having a shape corresponding to the trench op2. Next, anisotropic etching such as RIE is performed using this insulating layer 135 as a mask, and the trench op2 penetrating the stacked body SBA, is formed. As a result, the insulating layer 131, the inter-layer insulating layer 103, and the insulating layer 134 are formed.

As shown in FIG. 9 and FIGS. 26 to 28, in step S107, the conductive layer 102 functioning as the control gate electrode of the memory cell MC, and so on, is formed.

Figure 26:
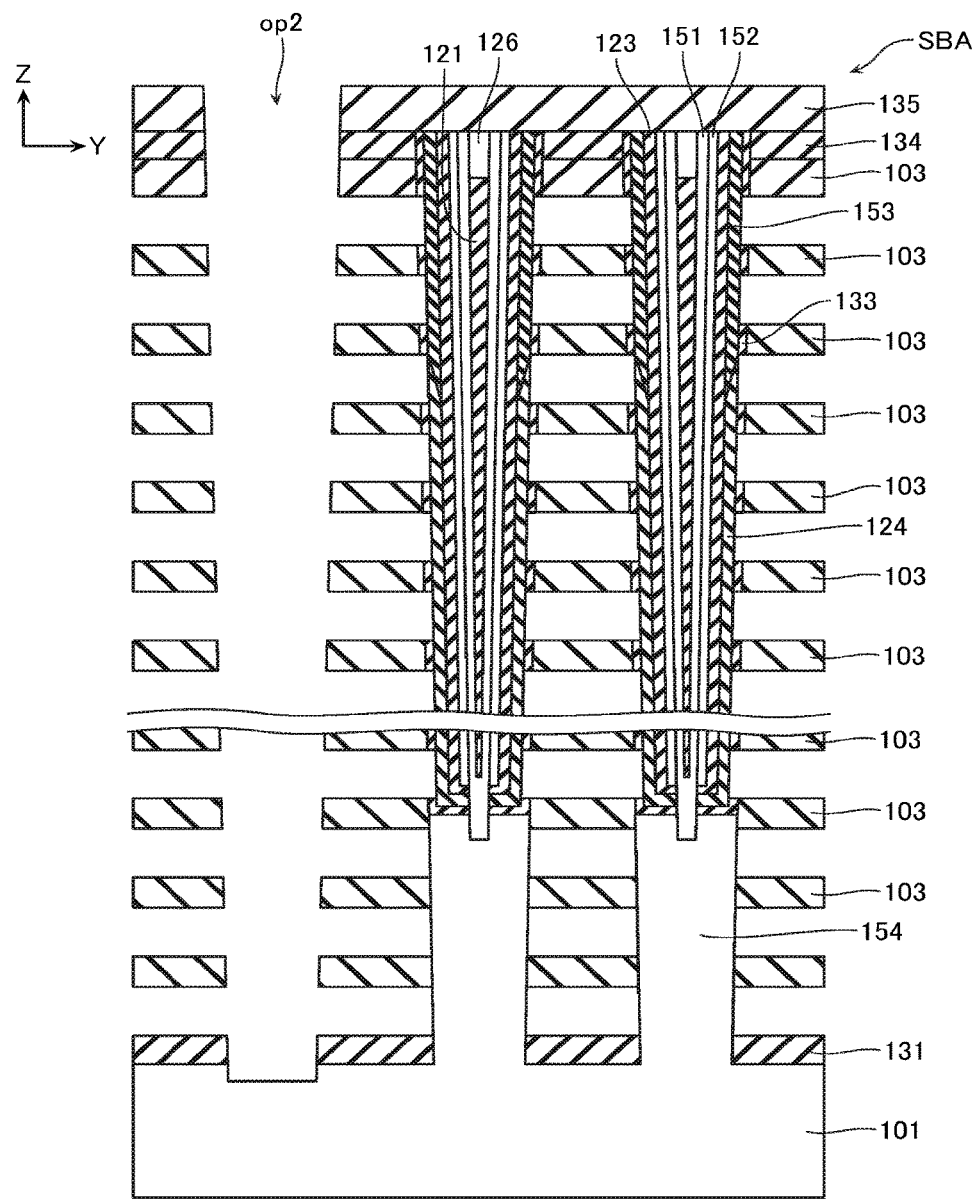
FIG. 26 is a cross-sectional view showing the same method of manufacturing.

That is, first, as shown in FIG. 26, the sacrifice layer 141A is removed via the trench op2 by a means such as dry etching employing a gas of hydrofluoric acid or wet etching employing phosphoric acid. In addition, part of the insulating layer 133A is removed via the trench op2 by a means such as wet etching employing hydrofluoric acid. As a result, the cover insulating layer 133 is formed.

Figure 27:
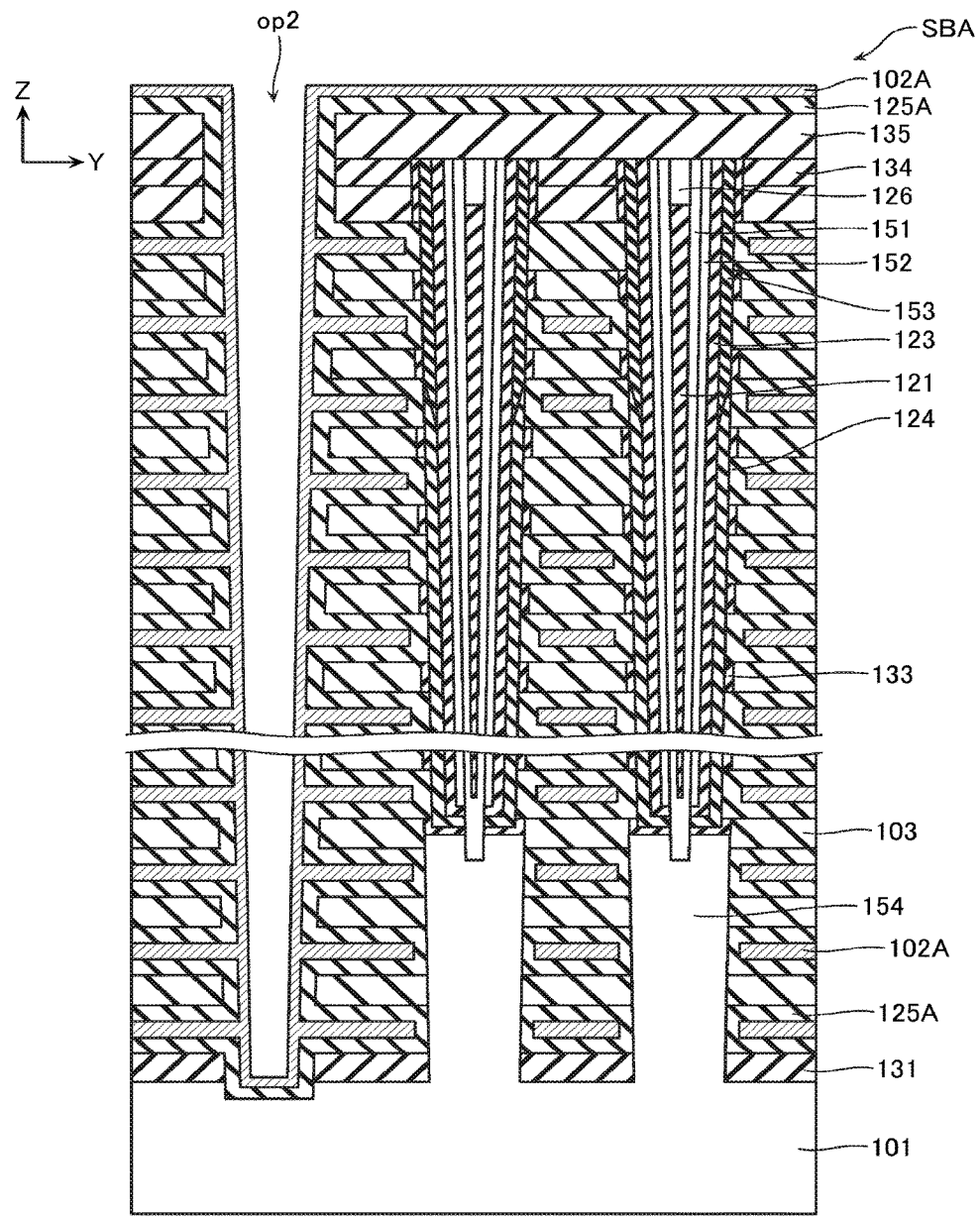
FIG. 27 is a cross-sectional view showing the same method of manufacturing.

Next, as shown in FIG. 27, an insulating layer 125A which will be the block insulating layer 125 is formed, via the trench op2, on an upper surface of the substrate 101, an upper surface, lower surface, and side surface of the inter-layer insulating layer 103, a side surface of the charge accumulation layer 124, and the upper surface of the stacked body SBA. Moreover, a conductive layer 102A which will be the conductive layer 102 is formed in a portion between the inter-layer insulating layers 103 adjacent in a stacking direction.

Figure 28:
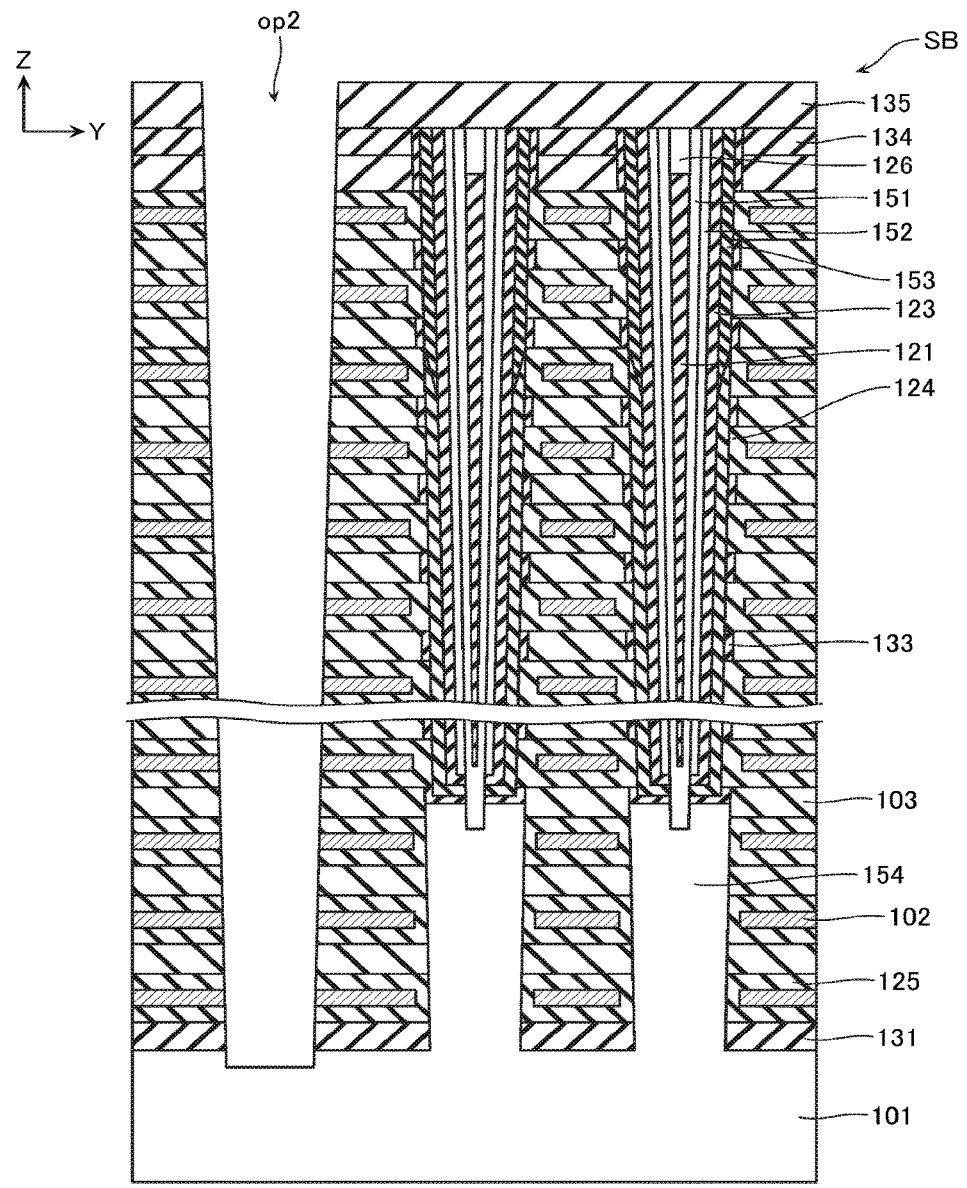
FIG. 28 is a cross-sectional view showing the same method of manufacturing.

Next, as shown in FIG. 28, portions positioned on the upper surface of the substrate 101, portions positioned on the side surface of the inter-layer insulating layer 103, and portions positioned on the upper surface of the stacked body SBA, of the insulating layer 125A and the conductive layer 102A, are removed. As a result, the block insulating layer 125 and the conductive layer 102 divided in the Z direction, are formed.

Subsequently, as shown in FIGS. 9 and 5, in step S108, a spacer insulating layer 136 and the conductive layer 108 are formed, a through hole penetrating the spacer insulating layer 136 and the insulating layer 135 is formed at an upper portion of the memory columnar body 105, and a bit line contact 137 is formed in this through hole. As a result, the nonvolatile semiconductor memory device described with reference to FIG. 5 is manufactured.

Note that in the present embodiment, the insulating layer 123A which will be the tunnel insulating layer 123 was formed in step S105 after oxidizing the upper portion of the charge accumulation layer 124A in step S104. However, the upper portion of the charge accumulation layer 124A may be oxidized after forming the insulating layer 123A, for example.

Next, step S104 will be described in more detail with reference to FIG. 17. Hereafter, an example where the upper portion of the charge accumulation layer 124A is oxidized by a plasma oxidation method will be described. Note that a, b, and c in FIG. 17 each express a height.

In the plasma oxidation method, the charge accumulation layer 124A is oxidized by an oxygen radical. Now, the oxygen radical collides with an inner wall of the opening op1 and gradually loses energy. Therefore, the oxygen radical oxidizes the charge accumulation layer 124A in a different mode depending on a height within the opening op1.

For example, the oxygen radical positioned at a height a in FIG. 17 has sufficient energy to oxidize the charge accumulation layer 124A over an entire film thickness. Therefore, at the height a, the charge accumulation layer 124A is oxidized over an entire film thickness.

Moreover, the oxygen radical positioned at a height b in FIG. 17, although having energy to partially oxidize the charge accumulation layer 124A, does not have enough energy to be able to oxidize the charge accumulation layer 124A over an entire film thickness. Therefore, at the height b, only a surface of the charge accumulation layer 124A is oxidized.

Moreover, the oxygen radical positioned at a height c in FIG. 17 does not have energy to oxidize the charge accumulation layer 124A. Therefore, at the height c, the charge accumulation layer 124A is not oxidized.

Therefore, by adopting the plasma oxidation method in step S104, it is made possible for the upper portion of the charge accumulation layer 124A to be selectively oxidized. In addition, it is made possible for the boundary line of the charge accumulation layer 124 and the oxide layer 153A to be inclined so as to be positioned more downwardly the closer its position is to the semiconductor layer 122 and more upwardly the closer its position is to the conductive layer 102.

[Second Embodiment]

Figure 29:
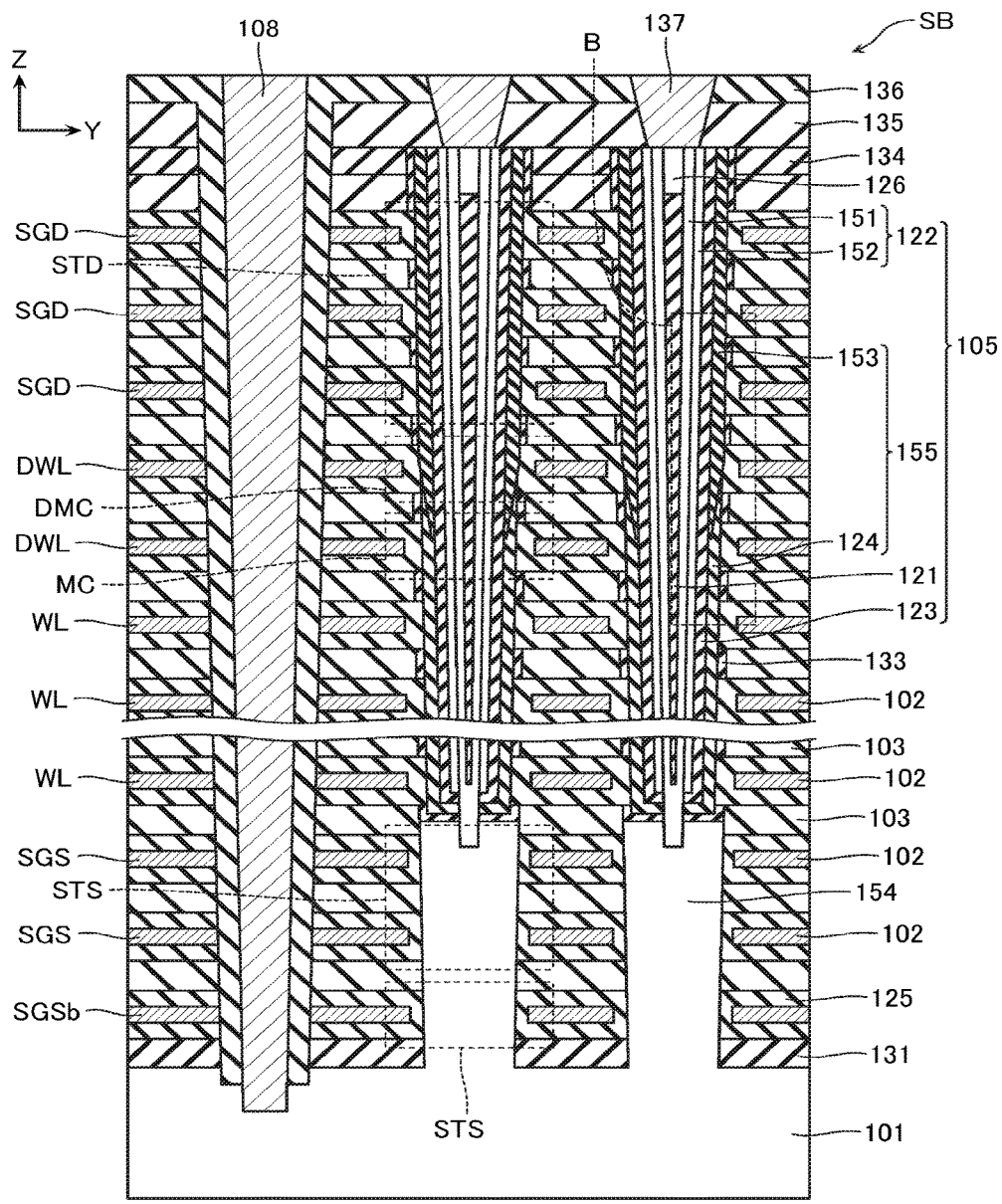
FIG. 29 is a cross-sectional view showing a configuration of part of a nonvolatile semiconductor memory device according to a second embodiment.
Figure 30:
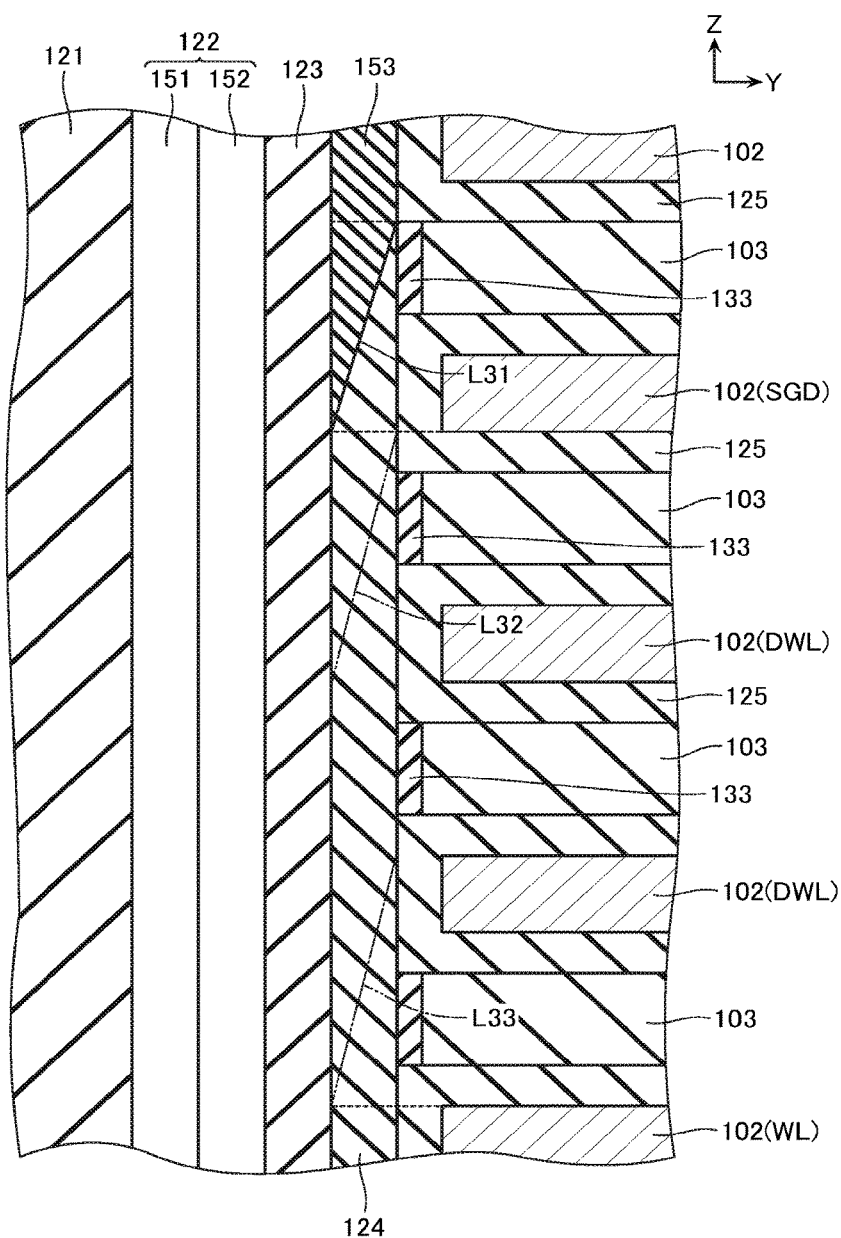
FIG. 30 is a cross-sectional view showing a configuration of part of the same nonvolatile semiconductor memory device.

Next, a configuration of a nonvolatile semiconductor memory device according to a second embodiment will be described with reference to FIGS. 29 and 30. FIG. 29 is a cross-sectional view showing a configuration of part of the same nonvolatile semiconductor memory device. FIG. 30 is a cross-sectional view showing a configuration of part of the same nonvolatile semiconductor memory device, and shows an enlarged view of the portion indicated by B of FIG. 29. Note that in the description below, portions similar to those of the nonvolatile semiconductor memory device according to the first embodiment are assigned with identical reference symbols to those assigned in the first embodiment, and descriptions thereof will be omitted.

As shown in FIG. 29, the nonvolatile semiconductor memory device according to the second embodiment is basically configured similarly to the nonvolatile semiconductor memory device according to the first embodiment, but differs from the nonvolatile semiconductor memory device according to the first embodiment in the following points.

That is, as shown in FIGS. 29 and 30, in the present embodiment, a dummy memory cell DMC is provided between the plurality of memory cells MC and the drain side select gate transistor STD. Moreover, some of the conductive layers 102 function as a control gate electrode of this dummy memory cell DMC and as a dummy word line DWL. Note that the dummy memory cell DMC is different from the memory cell MC, that is, the dummy memory cell DMC does not record user data.

Now, as shown in FIG. 30, in the present embodiment, similarly to in the first embodiment, a boundary line L31 of the charge accumulation layer 124 and the oxide layer 153 is positioned more upwardly than the word line WL positioned in an uppermost layer, and is positioned more downwardly than the upper surface of the drain side select gate line SGD positioned in an uppermost layer. Moreover, as shown in FIG. 30, in the present embodiment, the dummy word line DWL is provided between the word line WL and the drain side select gate line SGD. Therefore, in the present embodiment, a spacing between the word line WL and the drain side select gate line SGD is widened, and a margin in the Z direction of the boundary line L31 is increased, thereby making it possible to further suppress variation in characteristics of the drain side select gate transistor STD.

Moreover, as indicated by lines L32 and L33 in FIG. 30, it is also possible for the boundary line of the charge accumulation layer 124 and the oxide layer 153 to be provided in a range from an upper surface of the uppermost layer word line WL to the lowermost layer drain side select gate line SGD. As a result, variation in characteristics of the drain side select gate transistor STD can be further suppressed.

Note that the number of dummy word lines DWL can be set to any number. Moreover, in the present embodiment, the dummy word line DWL is provided between the word line WL and the drain side select gate line SGD, but it is also possible for a film thickness of the inter-layer insulating layer 103 positioned between the word line WL and the drain side select gate line SGD to be increased, thereby increasing the margin in the Z direction of the boundary line L31.

[Third Embodiment]

Figure 31:
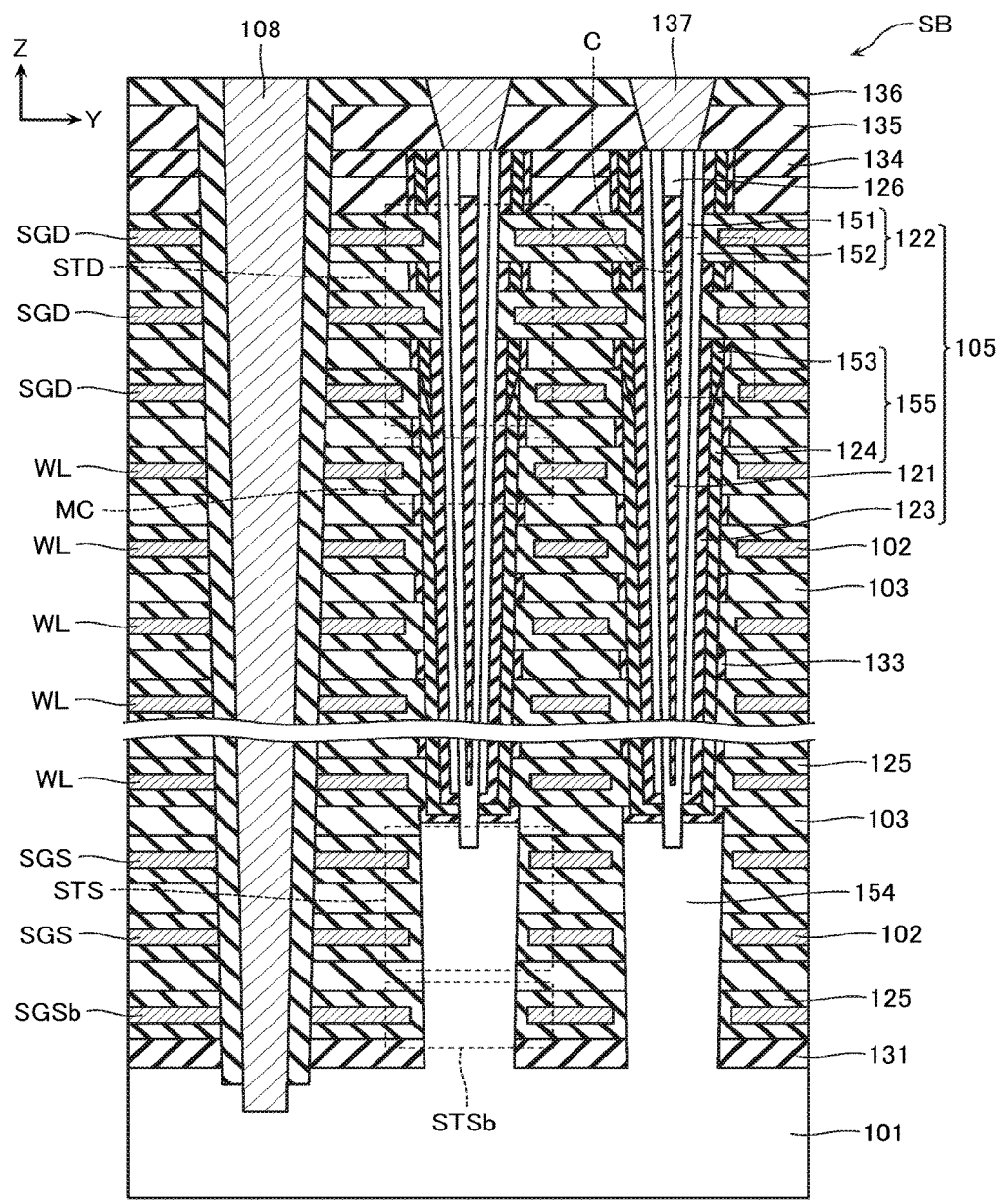
FIG. 31 is a cross-sectional view showing a configuration of part of a nonvolatile semiconductor memory device according to a third embodiment.
Figure 32:
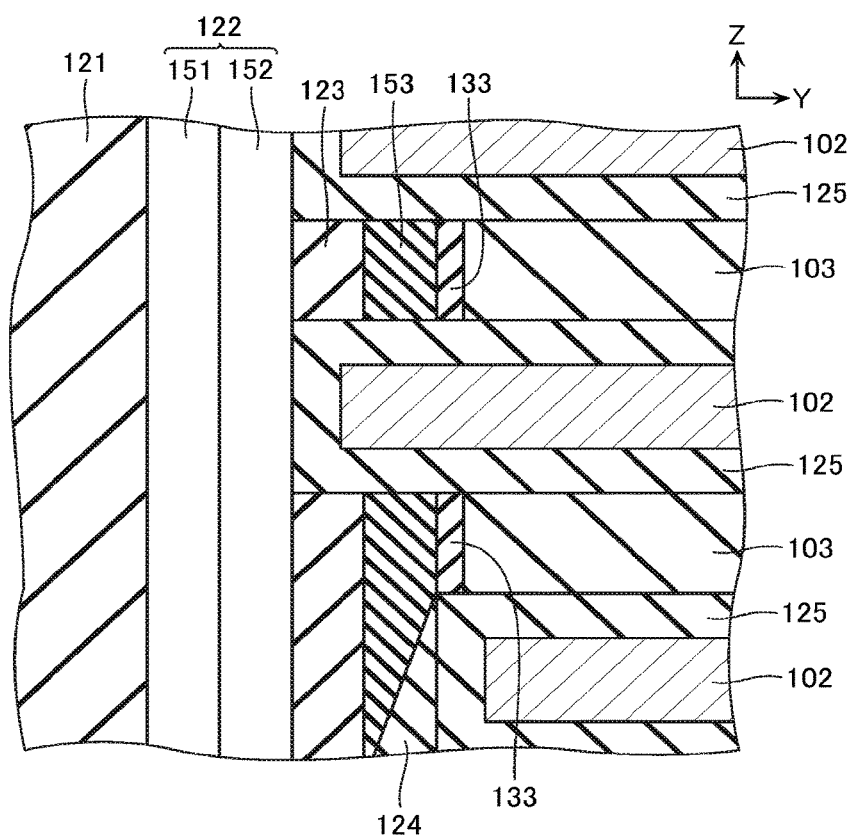
FIG. 32 is a cross-sectional view showing a configuration of part of the same nonvolatile semiconductor memory device.

Next, a configuration of a nonvolatile semiconductor memory device according to a third embodiment will be described with reference to FIGS. 31 and 32. FIG. 31 is a cross-sectional view showing a configuration of part of the same nonvolatile semiconductor memory device. FIG. 32 is a cross-sectional view showing a configuration of part of the same nonvolatile semiconductor memory device, and shows an enlarged view of the portion indicated by C of FIG. 31. Note that in the description below, portions similar to those of the nonvolatile semiconductor memory device according to the first embodiment are assigned with identical reference symbols to those assigned in the first embodiment, and descriptions thereof will be omitted.

As shown in FIG. 31, the nonvolatile semiconductor memory device according to the third embodiment is basically configured similarly to the nonvolatile semiconductor memory device according to the first embodiment, but differs from the nonvolatile semiconductor memory device according to the first embodiment in the following points.

That is, as shown in FIGS. 31 and 32, in the nonvolatile semiconductor memory device according to the third embodiment, the tunnel insulating layer 123 and the oxide layer 153 are divided between the semiconductor layer 122 and the drain side select gate line SGD. Therefore, the oxide layer 153 is not provided between the semiconductor layer 122 and the drain side select gate line SGD, and the drain side select gate line SGD contacts the semiconductor layer 122 via the block insulating layer 125.

In the nonvolatile semiconductor memory device comprising such a configuration, a distance of the drain side select gate line SGD from the semiconductor layer 122 can be made closer compared to in the nonvolatile semiconductor memory device according to the first embodiment. Therefore, a gate voltage of the drain side select gate transistor STD can be lowered to achieve a reduction in power consumption of the nonvolatile semiconductor memory device.

Figure 33:
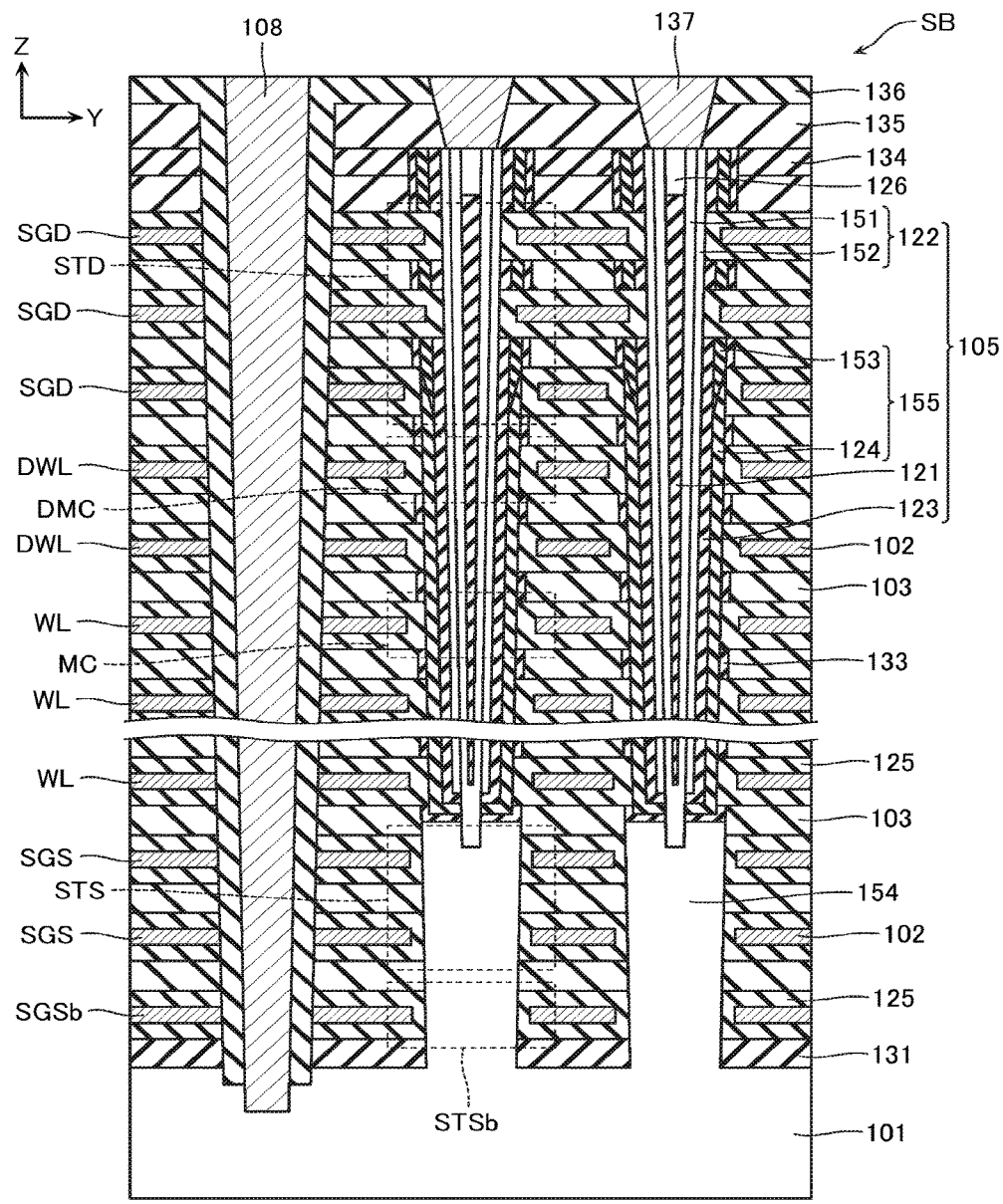
FIG. 33 is a cross-sectional view showing a configuration of a modified example of the same nonvolatile semiconductor memory device.

Note that as shown in FIG. 33, in the present embodiment also, as described in the second embodiment, a dummy memory cell DMC maybe provided between the word line WL and the drain side select gate line SGD.

Figure 34:
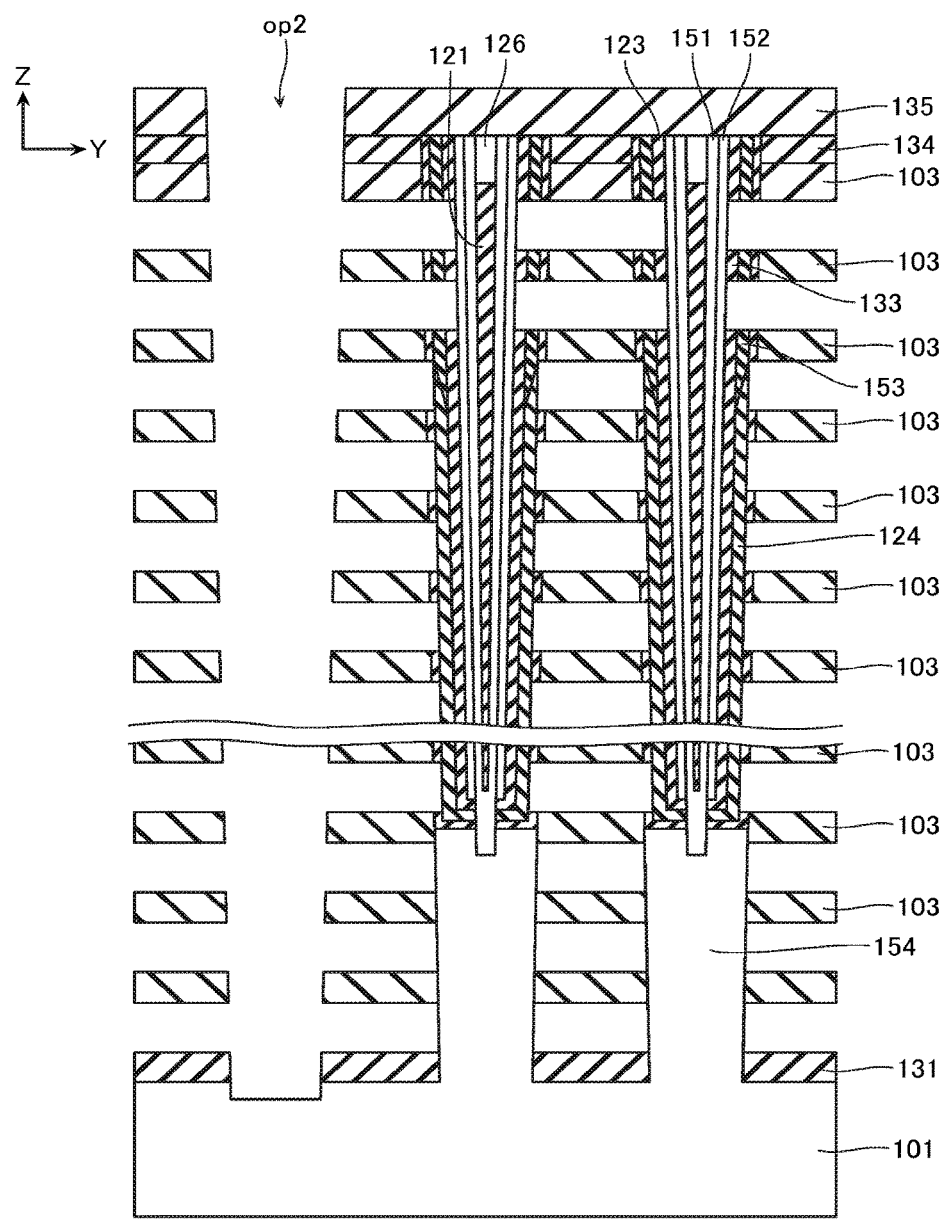
FIG. 34 is a cross-sectional view showing a method of manufacturing the same nonvolatile semiconductor memory device.

Next, a method of manufacturing the nonvolatile semiconductor memory device according to the third embodiment will be described with reference to FIG. 34. FIG. 34 is a cross-sectional view for explaining the same method of manufacturing. Note that in the description below, portions similar to those of the first embodiment are assigned with identical reference symbols to those assigned in the first embodiment, and descriptions thereof will be omitted.

The method of manufacturing according to the present embodiment is basically performed similarly to the method of manufacturing according to the first embodiment, but the step described with reference to FIG. 26 differs partially.

That is, as shown in FIG. 34, in the method of manufacturing according to the present embodiment, the sacrifice layer 141A is removed via the trench op2 by a means such as dry etching employing a gas of hydrofluoric acid or wet etching employing phosphoric acid. Moreover, in the method of manufacturing according to the present embodiment, parts of the insulating layer 133A, the oxide layer 153, and the tunnel insulating layer 123 are removed via the trench op2 by a means such as wet etching employing hydrofluoric acid. Other steps are performed similarly to in the method of manufacturing according to the first embodiment.

Now, the insulating layer 133A, the oxide layer 153, and the tunnel insulating layer 123 are all formed from silicon oxide ($SiO_2$). Therefore, the insulating layer 133A, the oxide layer 153, and the tunnel insulating layer 123 can be batch processed by the means such as wet etching employing hydrofluoric acid.

[Other Embodiments]

In the above-described embodiments, a plurality of the conductive layers 102 were used as the control gate of the drain side select gate transistor STD and as the drain side select gate line SGD. However, it is also possible for the control gate of the drain side select gate transistor STD and the drain side select gate line SGD to be configured by only a single layer of the conductive layers 102.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a plurality of control gate electrodes stacked above a substrate;
    a semiconductor layer having as its longitudinal direction a direction perpendicular to the substrate, the semiconductor layer facing the plurality of control gate electrodes;
    a first insulating layer positioned between the semiconductor layer and one of the plurality of the control gate electrodes, a first part of the first insulating layer being a charge accumulation layer, and a second part of the first insulating layer being an oxide layer positioned upwardly of the charge accumulation layer; and
    a second insulating layer positioned between the semiconductor layer and the first insulating layer, the second insulating layer contacting the charge accumulation layer and the oxide layer,
    a boundary of the charge accumulation layer and the oxide layer including an inclined portion extending through the charge accumulation layer and the oxide layer and extending from a position closer to the control gate electrodes to a position closer to the semiconductor layer, the oxide layer not extending beyond a lower portion of the inclined portion of the boundary, and
    at least one of the plurality of the control gate electrodes facing the semiconductor layer through the inclined portion of the boundary of the charge accumulation layer and the oxide layer.

2. The semiconductor memory device according to claim 1, further comprising:
    a third insulating layer provided between the first insulating layer and the control gate electrode.

3. The semiconductor memory device according to claim 1, wherein
    the plurality of control gate electrodes include a first control gate electrode and a second control gate electrode positioned more upwardly than the first control gate electrode, and
    the boundary of the charge accumulation layer and the oxide layer is positioned more upwardly than the first control gate electrode and more downwardly than an upper surface of the second control gate electrode.

4. The semiconductor memory device according to claim 3, comprising:
    a memory string including a plurality of memory cells connected in series; and
    a select gate transistor connected to one end of the memory string,
    wherein the first control gate electrode functions as a control gate electrode of the memory cell, and
    the second control gate electrode functions as a control gate electrode of the select gate transistor.

5. The semiconductor memory device according to claim 4, wherein
    the plurality of control gate electrodes include a plurality of the second control gate electrodes, and
    the boundary of the charge accumulation layer and the oxide layer is positioned more downwardly than a lower surface of the second control gate electrode positioned in a lowermost layer.

6. The semiconductor memory device according to claim 4, further comprising
    a dummy memory cell provided between the memory cell and the select gate transistor,
    wherein the plurality of control gate electrodes further include a third control gate electrode positioned between the first control gate electrode and the second control gate electrode, and
    the third control gate electrode functions as a control gate electrode of the dummy memory cell.

7. The semiconductor memory device according to claim 3, further comprising:
    a third insulating layer between the second control gate electrode and the first insulating layer, wherein
    the third insulating layer contacts the charge accumulation layer and the second control gate electrode.

8. The semiconductor memory device according to claim 3, further comprising:
    an inter-layer insulating layer provided between the first control gate electrode and the second control gate electrode; and
    a fourth insulating layer provided between the inter-layer insulating layer and the charge accumulation layer.

9. The semiconductor memory device according to claim 1, wherein
    a boundary line of the boundary of the charge accumulation layer and the oxide layer is a curved line.

10. The semiconductor memory device according to claim 1, wherein the second insulating layer physically contacts the charge accumulation layer and the oxide layer.

* * * * *